United States Patent [19]
Burns et al.

[11] Patent Number: 5,671,258
[45] Date of Patent: Sep. 23, 1997

[54] CLOCK RECOVERY CIRCUIT AND RECEIVER USING SAME

[75] Inventors: Lawrence M. Burns, Mountain View; Scott W. Mitchell, San Jose, both of Calif.

[73] Assignee: 3COM Corporation, Santa Clara, Calif.

[21] Appl. No.: 360,259

[22] Filed: Dec. 20, 1994

[51] Int. Cl.$^6$ ............................................ H04L 7/02
[52] U.S. Cl. .................... 375/359; 375/360; 370/518; 327/291
[58] Field of Search ........................ 375/354, 359–361, 375/371, 373; 348/500, 510, 512; 370/100.1, 108, 503, 516, 518, 517; 327/141, 143, 152, 153, 161, 231, 254, 255, 291, 293, 295

[56] References Cited

U.S. PATENT DOCUMENTS

| | | | |
|---|---|---|---|
| 4,592,077 | 5/1986 | Norton | 375/360 |
| 4,841,551 | 6/1989 | Avaneas | 375/359 |
| 4,949,364 | 8/1990 | Yukawa | 377/28 |
| 4,975,605 | 12/1990 | Bazes | 327/271 |
| 4,980,585 | 12/1990 | Bazes | 327/2 |
| 5,034,967 | 7/1991 | Cox et al. | 375/373 |
| 5,103,466 | 4/1992 | Bazes | 375/359 |
| 5,400,370 | 3/1995 | Guo | 375/359 |
| 5,412,697 | 5/1995 | Van Brunt et al. | 375/360 |
| 5,446,765 | 8/1995 | Leger | 375/359 |
| 5,504,751 | 4/1996 | Ledzius et al. | 370/100.1 |

OTHER PUBLICATIONS

M. Bazes, et al., "A Novel CMOS Digital Clock and Data Decoder", *IEEE Journal of Solid–State Circuits*, vol. 27, No. 12, pp. 1934–1940, Dec. 1992.

*Primary Examiner*—Stephen Chin
*Assistant Examiner*—Amanda T. Le
*Attorney, Agent, or Firm*—Wilson Sonsini Goodrich & Rosati

[57] ABSTRACT

A receiver for NRZ data does not require a separate transmission media for the clock. Rather, a clock recovery circuit is included in the receiver capable of recovering the clock based on transitions detected in the NRZ data alone. The clock recovery circuit comprises an edge detection circuit which receives the data stream and generates edge detection signals indicating transitions in the data stream. Reference clock generation circuitry generates a plurality of reference clock signals shifted in phase with respect to one another. Phase quantizing circuitry is responsive to the edge detection signals and the plurality of reference clock signals. The phase quantizing circuitry generates a quantization signal indicating one of the plurality of reference clock signals having a particular phase relationship to the edge detection signals. Clock selection circuitry, having inputs coupled to the plurality of reference clock signals and an output, is responsive to the quantization signal to select the indicated reference clock as the recovered clock signal for the data stream. The reference clock generation circuitry includes a local clock input to receive a local clock, and a reference generator which is responsive to the local clock to generate a first reference wave and a second reference wave one quarter cycle out of phase relative to the first reference wave. A plurality of reference clock generators generate respective reference clock signals in response to the first and second reference waves, each of the reference clock generators generating a reference clock signal having a phase determined by relative amplitudes of the first and second reference waves.

38 Claims, 16 Drawing Sheets

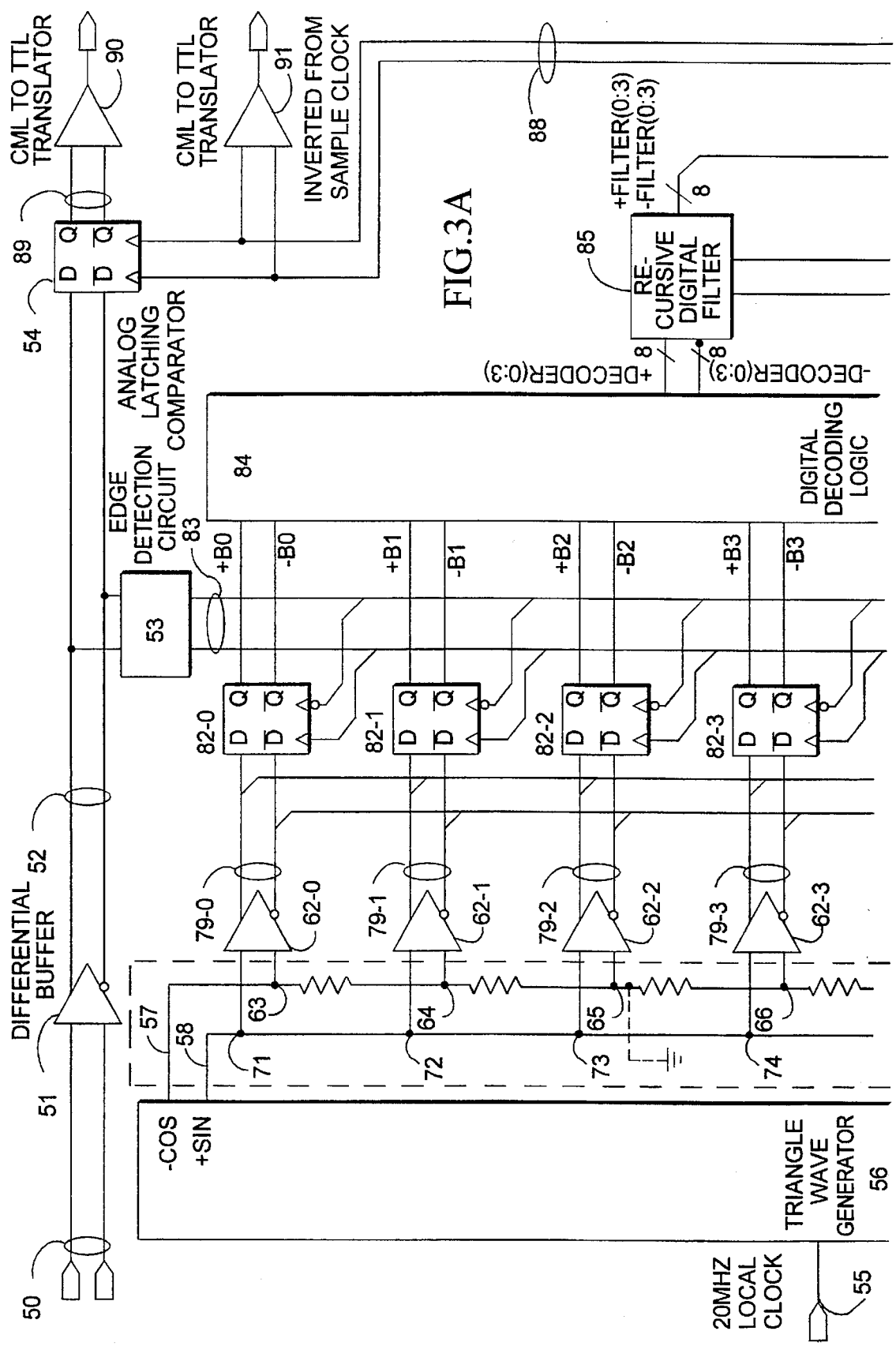

DECODING LOGIC TABLE

| C0 | C1 | C2 | C3 | C4 | C5 | C6 | C7 | B3 | B2 | B1 | B0 |
|---|---|---|---|---|---|---|---|---|---|---|---|
| 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 1 |
| 1 | 1 | 0 | 0 | 0 | 0 | 0 | 0 | 0 | 0 | 1 | 0 |
| 1 | 1 | 1 | 0 | 0 | 0 | 0 | 0 | 0 | 0 | 1 | 1 |
| 1 | 1 | 1 | 1 | 0 | 0 | 0 | 0 | 0 | 1 | 0 | 0 |
| 1 | 1 | 1 | 1 | 1 | 0 | 0 | 0 | 0 | 1 | 0 | 1 |
| 1 | 1 | 1 | 1 | 1 | 1 | 0 | 0 | 0 | 1 | 1 | 0 |
| 1 | 1 | 1 | 1 | 1 | 1 | 1 | 0 | 0 | 1 | 1 | 1 |
| 1 | 1 | 1 | 1 | 1 | 1 | 1 | 1 | 1 | 0 | 0 | 0 |
| 0 | 1 | 1 | 1 | 1 | 1 | 1 | 1 | 1 | 0 | 0 | 1 |
| 0 | 0 | 1 | 1 | 1 | 1 | 1 | 1 | 1 | 0 | 1 | 0 |
| 0 | 0 | 0 | 1 | 1 | 1 | 1 | 1 | 1 | 0 | 1 | 1 |
| 0 | 0 | 0 | 0 | 1 | 1 | 1 | 1 | 1 | 1 | 0 | 0 |
| 0 | 0 | 0 | 0 | 0 | 1 | 1 | 1 | 1 | 1 | 0 | 1 |
| 0 | 0 | 0 | 0 | 0 | 0 | 1 | 1 | 1 | 1 | 1 | 0 |
| 0 | 0 | 0 | 0 | 0 | 0 | 0 | 1 | 1 | 1 | 1 | 1 |

$B0 = C0 \oplus C1 \oplus C2 \oplus C3 \oplus C4 \oplus C5 \oplus C6 \oplus C7$
$B1 = C1 \oplus C3 \oplus C5 \oplus C7$
$B2 = C3 \oplus C7$
$B3 = C7$

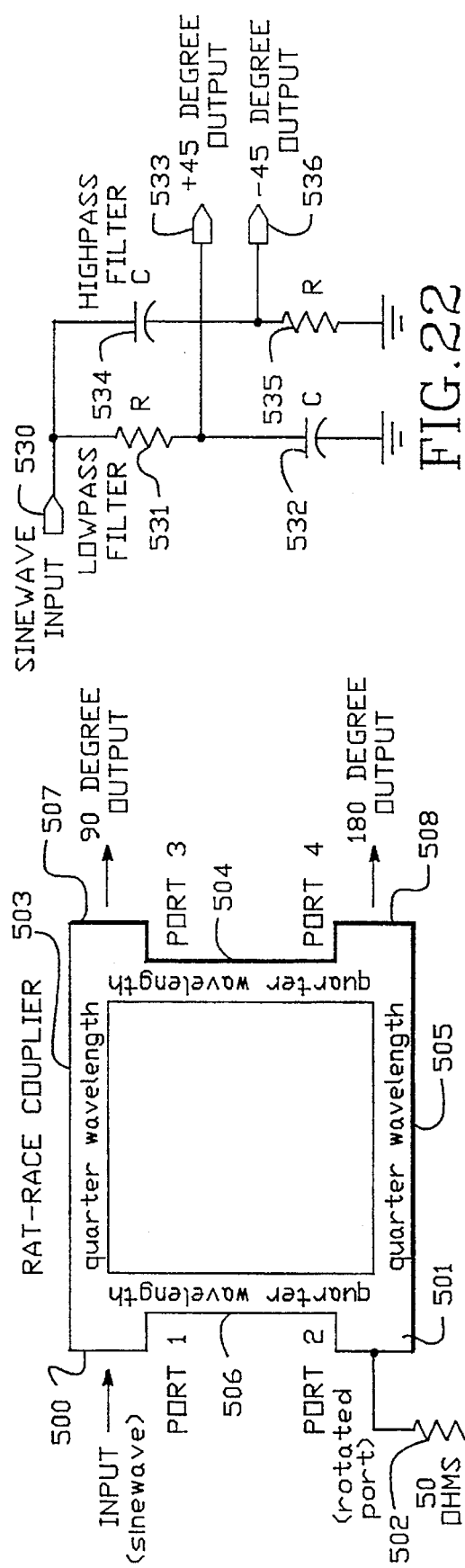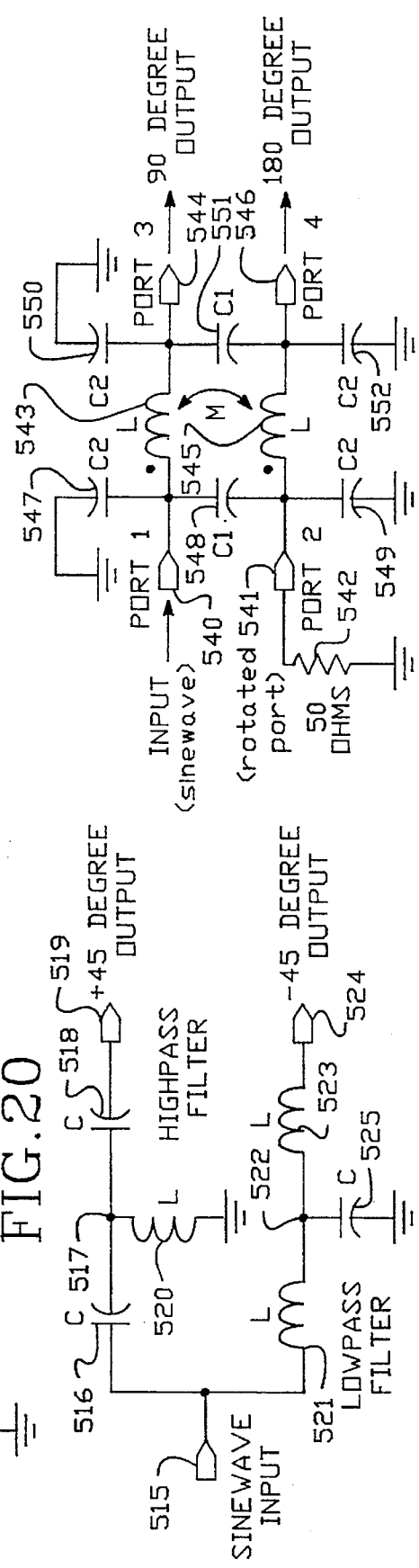

CLOCK RECOVERY CIRCUIT AND RECEIVER USING SAME

BACKGROUND OF THE INVENTION

1. Field of the Invention

The present invention relates generally to the field of receivers for encoded data, and more particularly to clock recovery circuits for ensuring that a receiver is capable of generating a clock synchronized with incoming data.

2. Description of Related Art

Receivers for serial transmitted data typically include clock recovery circuits so that they may produce a clock signal synchronized with the incoming data to insure valid reading of the data. Clock recovery circuits in the prior art typically include a phase locked loop (PLL) which tracks transitions in the received data stream to keep the local clock locked in phase. However, for data which does not include a large number of transitions, a PLL may lose its lock on the incoming data stream, resulting in erroneous detection of data. For this reason, most serial data streams are encoded with both data and clock, using so-called phase encoded data streams. For instance, an industry standard local area network IEEE 802.3, also known as Ethernet, relies on Manchester encoding. A Manchester encoded data stream on the network medium is guaranteed to have at least one transition for every bit of data. This allows receivers of the Manchester encoded data to use phase lock loops effectively.

An alternative technique for generating a local clock in phase with incoming Manchester encoded data is described in Bazes, et al., "A Novel CMOS Digital Clock and Data Decoder", IEEE Journal of Solid-State Circuits, Vol. 27, No. 12, December 1992.

The Bazes system is based on a waveform digitizer which quantizes the phase of transitions in an incoming data stream. The digitizer utilizes a synchronous delay line which has 32 taps for each cycle of a reference clock to provide 32 digitized samples of the incoming data per clock cycle. The waveform digitizer in effect quantizes the phase of the incoming stream into a string of 32 ones and zeroes, where ones appear wherever the input data waveform is high, and zeroes appear where the input data waveform is low. A transition detector identifies 10 or 01 pairs in the digitized waveform, to quantify the phase relationship of input data transitions with respect to the local reference clock. An output clock is generated by a mask generator which is responsive to the position of the transitions to align the produced receive clock pattern with the input data.

The Bazes, et al., design is quite complicated, using significant area on an integrated circuit implementing the technique. Also, it relies on capacitance values in the synchronous delay line, making it difficult to design. In particular, laying out the synchronous delay line, several process iterations are likely required to insure accurate delay amongst the various stages. See also, U.S. Pat. Nos. 4,980,585; 4,975,605; and 5,103,466, all invented by Bazes, relating to the implementation of the digital clock and data decoder. As stated in Bazes' U.S. Pat. No. 5,103,466, the technique designed by him is particularly applied to "phase encoded" serial data, such as Manchester encoded data. According to Bazes, for non-return-to zero (NRZ) data encoding, or other "non-phase encoding" schemes, two transmission media (i.e., two sets of wires) are usually required—one for the data and one for the clock (see, Bazes '466, column 4, lines 10–12). In some environments, NRZ data has been used without a separate clock transmission.

In the wireless communication domain, frequency bandwidth of the transmitted signal is critical. Phase encoding, such as Manchester encoding, is undesirable because superimposed clock and data require twice the RF modulation bandwidth to communicate a given amount of data. Thus, it would be desirable to transmit NRZ or other non-phase encoded data streams in the wireless domain. However, clock recovery from non-phase encoded data is difficult, because the possibility that transitions in the transmitted data stream will be separated by many clock periods. Thus, a stable clock recovery circuit is necessary for non-phase encoded data, such as NRZ data, which is practical to implement in integrated circuit technology, and can be used for relatively high data rate radio transmissions.

SUMMARY OF THE INVENTION

The present invention provides a receiver for NRZ data which does not require a separate transmission media for the clock. Rather, a clock recovery circuit is included in the receiver capable of recovering the clock based on transitions detected in the NRZ data alone. Furthermore, the clock recovery circuit in the receiver according to the present invention may be reliably implemented in a wide variety of integrated circuit technologies, and may be easily scaled over a wide frequency range.

The clock recovery circuit for an NRZ data stream, according to the present invention, comprises an edge detection circuit which receives the NRZ data stream and generates edge detection signals indicating transitions in the NRZ data stream. Reference clock generation circuitry generates a plurality of reference clock signals shifted in phase with respect to one another. Phase quantizing circuitry is responsive to the edge detection signals and the plurality of reference clock signals. The phase quantizing circuitry generates a quantization signal indicating one of the plurality of reference clock signals having a particular phase relationship to the edge detection signals. Clock selection circuitry, having inputs coupled to the plurality of reference clock signals and an output, is responsive to the quantization signal to select the indicated reference clock as the recovered clock signal for the NRZ data stream.

The reference clock generation circuitry, according to one aspect, includes a local clock input to receive a local clock, and a reference generator which is responsive to the local clock to generate a first reference wave and a second reference wave one quarter cycle out of phase relative to the first reference wave. Both the first and second reference waves have the same amplitude. A plurality of reference clock drivers generate respective reference clock signals in response to the first and second reference waves, each of the reference clock drivers generating a reference clock signal having a phase determined by relative amplitudes of the first and second reference waves. In one preferred system, the first and second reference waves comprise sine and cosine triangle waves.

The clock generators, in one preferred embodiment well suited to integrated circuit implementation, comprise comparators connected to receive the first and second reference waves at their inputs. The trip value for one of the two inputs is set using a resistor ladder, based on analog resistor ratioing which greatly minimizes the effects of process and temperature variations in setting the relative phase of the plurality of reference clock signals in an integrated circuit environment.

The phase quantizing circuitry includes a plurality of memory elements, having respective inputs coupled to corresponding ones of the plurality of reference clock signals. The plurality of memory elements store a state of the plurality of reference clock signals upon a detected transition in the NRZ data stream indicated by the edge detection signals. Circuitry responsive to the stored state supplies the quantization signal.

The circuity supplying the quantization signal includes a digital decoder responsive to the stored state to produce a state decode signal. In addition, a recursive digital filter which filters the state decode signal to produce the quantization signal may be applied in low signal-to-noise environments.

The present invention may also be characterized as a receiver for a radio transmitted NRZ data stream, including clock recovery circuitry as described above.

The present invention is capable of achieving clock synchronization on as little as one clock transition in a high signal-to-noise environment, if the recursive digital filter is bypassed. Alternatively, the averaging effect of the filter may be applied to a number of data transitions to get a more accurate idea of the true phase of the recovered clock, such as may be required in a low signal-to-noise environment. Use of a recursive filter is especially good when a "training sequence" is available, that is, when a preamble on a data packet can be used to achieve an initial lock.

Unlike other clock recovery circuits, the present invention does not require that the data be phase encoded, such as Manchester encoded. It allows use of non-phase encoded data, such as NRZ, in a wireless communication environment. This allows the wireless network to use one-half the RF modulation bandwidth compared to a Manchester encoded stream.

The clock recovery circuit is not based on phase lock loop technology. This avoids the long settling times required to achieve lock, the relatively high part counts, and high gain operational amplifiers required in phase lock loop circuitries.

Furthermore, the present invention can be scaled over a wide frequency range. This is true because of the reliance on resistor ratioing and other simple techniques to produce the reference clocks. The analog delay cells relied on in the Bazes prior art have a very narrow range of operation and may not be easily adjustable over a significant range.

Finally, the circuit is relatively simple to implement, resulting in lower power dissipation, smaller size, and less cost in an integrated circuit environment.

Other aspects and advantages of the present invention can be seen upon review of the figures; the detailed description, and the claims which follow.

BRIEF DESCRIPTION OF THE FIGURES

FIG. 20 is a schematic diagram of a "rat-race coupler" used for generating sine waves 90 degrees out of phase with one another.

FIG. 21 is a schematic diagram of a circuit for generating sine waves 90 degrees out of phase with respect to one another based on the use of a high pass filter and a low pass filter.

FIG. 22 is an alternative implementation of a circuit for generating sine waves 90 degrees out of phase with one another using a low pass and a high pass filter.

FIG. 23 is a schematic of an alternative implementation of a circuit for generating sine waves 90 degrees out of phase with respect to one another.

DETAILED DESCRIPTION

Figure 1:
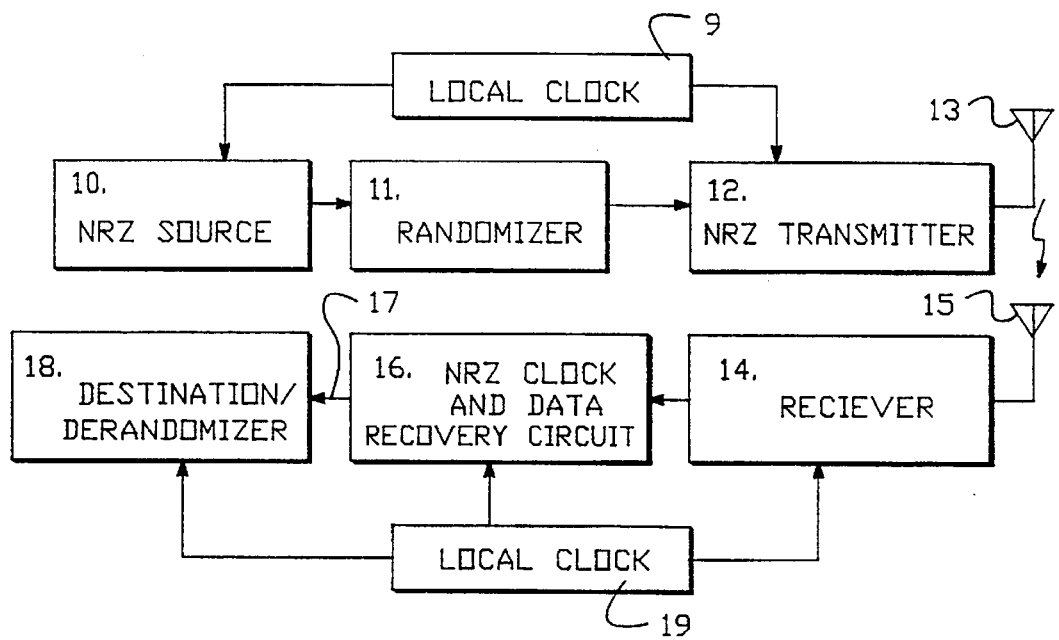
FIG. 1 is a schematic diagram of a transmitter and a receiver for NRZ data with a clock recovery circuit according to the present invention.

A detailed description of preferred embodiments of the present invention is provided with reference to the figures. FIG. 1 illustrates a wireless environment utilizing a receiver having a clock and data recovery circuit according to the present invention.

In the system of FIG. 1, a source 10 of data produces a non-return-to-zero (NRZ) data stream. This data stream is preferably supplied through a randomizer 11 to increase the average number of transitions per unit time in the data stream by, for instance, logically combining it with a psuedorandom bit pattern. The randomizer may or may not be required for a given environment. The randomized data stream is then supplied to a transmitter 12 adapted to drive the NRZ encoded serial data stream into the communication medium. In the embodiment illustrated, the communication medium is wireless radio, which is bandwidth limited such that avoiding the need to transmit a clock signal is important for high data rates. Thus, the transmitter 12 includes an antenna 13 which couples the serial data stream into the communication medium. Other bandwidth limited communication media may be used, such as twisted pair cable and coaxial cable.

The transmitted data stream is then propagated to a receiver 14 which includes an antenna 15 for coupling the transmitted serial data stream from the communication medium into the receiver 14. Coupled to the receiver is an NRZ clock and data recovery circuit 16 which receives the data stream from the receiver 14 and produces a local data stream with a synchronized recovered clock signal on line 17. This data is then supplied to a de-randomizer and destination equipment 18.

In one application of this technology, both the source 10 and destination 18 operate an Ethernet type protocol, and include stable local clocks 9 and 19.

The NRZ data stream is an example of a non-phase encoded data stream. The non-phase encoded data stream carries a higher amount of data per unit bandwidth than a phase encoded data stream, such as Manchester encoded data. However, it suffers the disadvantage that there may be a significant number of clock cycles before a transition occurs in the transmitted data stream. Thus, the present invention is particularly suited to bandwidth limited wireless communication media. However, the clock and data recovery technique applies to any data communication medium.

Figure 2:
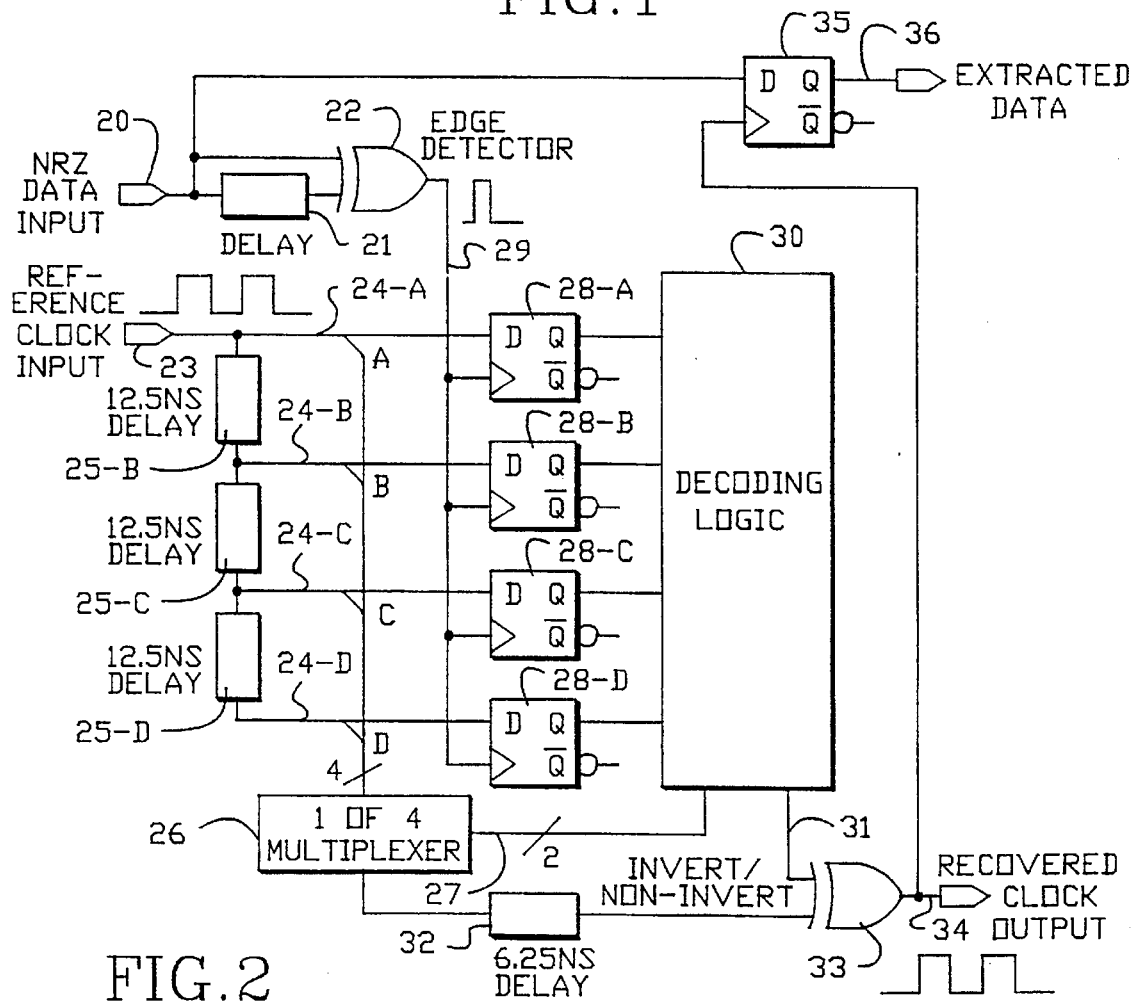
FIG. 2 is a simplified diagram of the clock recovery circuit according to the present invention.

FIG. 2 shows a simplified form of a phase quantizer based clock recovery circuit according to the present invention. The circuit receives a local NRZ data stream on input 20. This input is supplied to an edge detector which includes delay 21 and exclusive OR gate 22. By supplying a first input to the exclusive OR gate 22 through the delay 21 and a second input directly from the data input 20, a pulse is generated at the output of the exclusive OR gate 22 on each transition in the NRZ data stream. An option is to use a non-retriggerable one-shot circuit, or a set/reset flip-flop circuit to "block off" most of the data period after the first zero crossing.

The circuit also includes a reference clock input 23. The reference clock input is used to generate a plurality of reference clock signals on lines 24-A, 24-B, 24-C, and 24-D. The reference clock signals 24-A through 24-D are shifted in phase with respect to one another. In the simplified diagram of FIG. 2, the phase shifting is accomplished using the tapped delay line, including delay element 25-B, delay element 25-C, and delay element 25-D. Each of the delay elements 25-B through 25-D in the example illustrated induces a 12.5 nanosecond delay in the reference clock supplied on line 23.

The four reference clock signals are supplied to respective inputs of a 1 of 4 multiplexer 26 which is controlled by a quantization signal on line 27.

The reference clock signals are also coupled to a bank of memory elements 28-A through 28-D. The memory elements store the state of the respective reference clock signals in response to the edge detection signal on line 29 produced at the output of the exclusive OR gate 22. The stored state is supplied from the outputs of the memory elements 28-A through 28-D to decoding logic 30. The decoding logic produces the quantization signal on line 27 selecting one of the reference clock signals which has a particular phase relationship with respect to the transition in the NRZ data input.

In the example illustrated, with a 10 MHz reference clock, with four reference clock signals delayed in phase by 12.5 nanoseconds, the selectable reference clock signals cover one-half of the 100 nanosecond cycle time of the 10 MHz clock. However, the four reference clock signals can be used to quantize the entire 100 nanosecond cycle, by inverting the appropriate clock signal. Thus, the decoding logic also generates an invert/non-invert signal on line 31. The selected clock from the multiplexer 26 is supplied through delay element 32 to a first input of exclusive OR gate 33. The second input to the exclusive OR gate 33 is the invert/non-invert signal 31. The output of the exclusive OR gate 33 is the recovered clock output on line 34.

The recovered clock output on line 34 is also supplied to clock register 35 which is used to recover synchronized data. The data input to the register 35 is the NRZ data stream on line 20. In response to the adjusted reference clock on line 34, the extracted data appears on line 36 at the output of register 35.

Thus, in operation, the reference clock feeds a series of delay lines, each 12.5 nanoseconds long, providing four reference clock signals. These reference clock signals provide four different phases covering about one half-cycle of the reference clock to the comparators. Only four reference clocks are used because they can be inverted to get a 180°-shifted version to cover the other half-cycle. Thus, the complexity of circuit is reduced.

The NRZ data input is fed to an edge detector circuit that produces a pulse whenever there is a positive or negative data transition. Whenever there is a data transition, the memory elements 28-A through 28-D take a "snapshot" of the instantaneous phase of the reference clocks with reference to the data. This state information is then decoded to select a particular reference clock signal which can be used in a true or inverted form, as appropriate, as the recovered clock.

The reference clock in the preferred system is a local, accurate, crystal oscillator, such as utilized in standard Ethernet adaptor environments. In this environment, the 10 MHz local oscillator, usually based on a divided 20 MHz clock, and both the transmitter and receiver are guaranteed to be accurate within +100 parts per million (ppm) or more preferably ±50 ppm, and it will likely take many cycles of data before the phase drifts far enough to lose synchronization. By randomizing the transmitted data and de-randomizing it at the receiver, the likelihood that a given data stream will include a long sequence without transitions is reduced substantially. With a very accurate local clock and randomized NRZ data, a reliable, cost-effective, and relatively simple data and clock recovery circuit is provided that is particularly suited to recovering a clock from NRZ encoded data from a wireless communication medium. Due to finite packet length in most network applications, a very accurate crystal oscillator reference can be used, such as available +2 parts per million crystal oscillators, requiring only one data transition to achieve and maintain lock over the entire packet. However, the randomizer reduces the need for highly accurate and expensive crystal oscillators, as well as aiding the operation of other transmitter circuits.

Figure 3B:
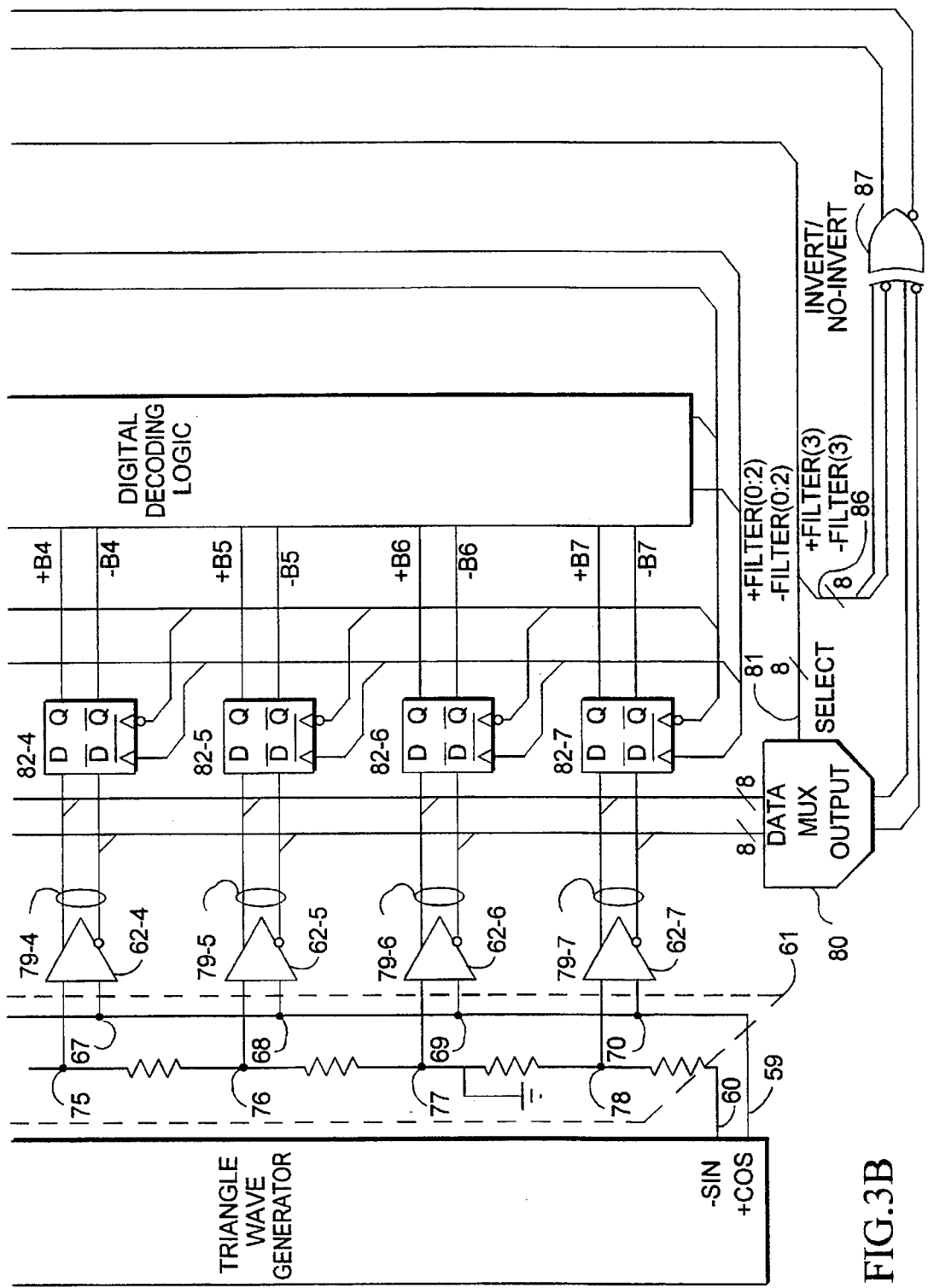
FIG. 3 is a more detailed schematic diagram of the clock recovery circuit according to the present invention.

FIG. 3 provides a more detailed schematic diagram of a preferred embodiment of the present invention, designed to be implemented in a bipolar integrated circuit. Other integrated circuit technologies, such as CMOS technology could be applied as well. In the preferred embodiment, all of the elements in FIG. 3 are implemented on a single integrated circuit.

As illustrated in FIG. 3, the receiver produces a local NRZ data stream in a differential format on lines 50. The local data stream is fed on lines 50 through differential buffer 51 to lines 52. Lines 52 are supplied as input to edge detection circuitry 53. Edge detection circuitry is described below with reference to FIGS. 4 and 5. Also, the data stream on line 52 is supplied to the data recovery latch 54. The data recovery latch 54 is clocked by the recovered clock signal which is generated as described below.

The circuit receives as input a 20 MHz local clock signal in a single ended format such as TTL on line 55. This local clock signal is produced in reliance on the stable 10 MHz clock in the Ethernet environment, or with other equivalent, highly accurate clock technology. The local clock on line 55 is supplied to a triangle wave generator 56 which is described in alternative formats with respect to FIGS. 6 through 9. The triangle wave generator 56 produces two reference triangle waves in a differential format. Thus, the outputs include a minus cosine (–COS) output on line 57, a plus sine (+SIN) output on line 58, a plus cosine (+COS) output on line 59, and a minus sine (–SIN) output on line 60. These signals on lines 57 through 60 are supplied to a resistor ladder, generally 61. The resistor ladder is implemented using monolithic resistor technology in the preferred system, such as that described with reference to FIG. 15. The resistor ladder 61 drives a sequence of differential buffers 62-0 through 62-7.

Thus, the resistor ladder 61 includes nodes 63 to 78. Node 63 is coupled to line 57. Resistor R0 is coupled between node 63 and node 64. Resistor R1 is coupled between node 64 and node 65. Resistor R2 is coupled between node 65 and node 66. Resistor R3 is coupled between node 66 and node 67. Nodes 67, 68, 69, and 70 are all coupled to line 59. Similarly, nodes 71, 72, 73, 74, and 75 are all coupled to line 58. Resistor R4 is coupled between node 75 and node 76. Resistor R5 is coupled between node 76 and node 77. Resistor R6 is coupled between node 77 and node 78. Node 78 is coupled across resistor R7 to line 60.

Nodes 65 and 77 may not actually be connected to ground, but are in effect at a virtual AC ground, as indicated by the dashed connection.

Each of the differential buffers 62-0 through 62-7 produces a reference clock signal, 79-0 through 79-7, respectively. The inputs to the differential buffers are set to trip based on the relative magnitudes of the reference waves produced by the triangle wave generator, and set with precision by the resistor ladder 61. Thus, buffer 62-0 is coupled to nodes 71 and 63. Buffer 62-1 is coupled to nodes 72 and 64. Buffer 62-2 is coupled to nodes 73 and 65. Buffer 62-3 is coupled to nodes 74 and 66. Buffer 62-4 is coupled to nodes 75 and 67. Buffer 62-5 is coupled to nodes 76 and 68. Buffer 62-6 is coupled to nodes 77 and 69. Finally, buffer 62-7 is coupled to nodes 78 and 70.

Figure 4:
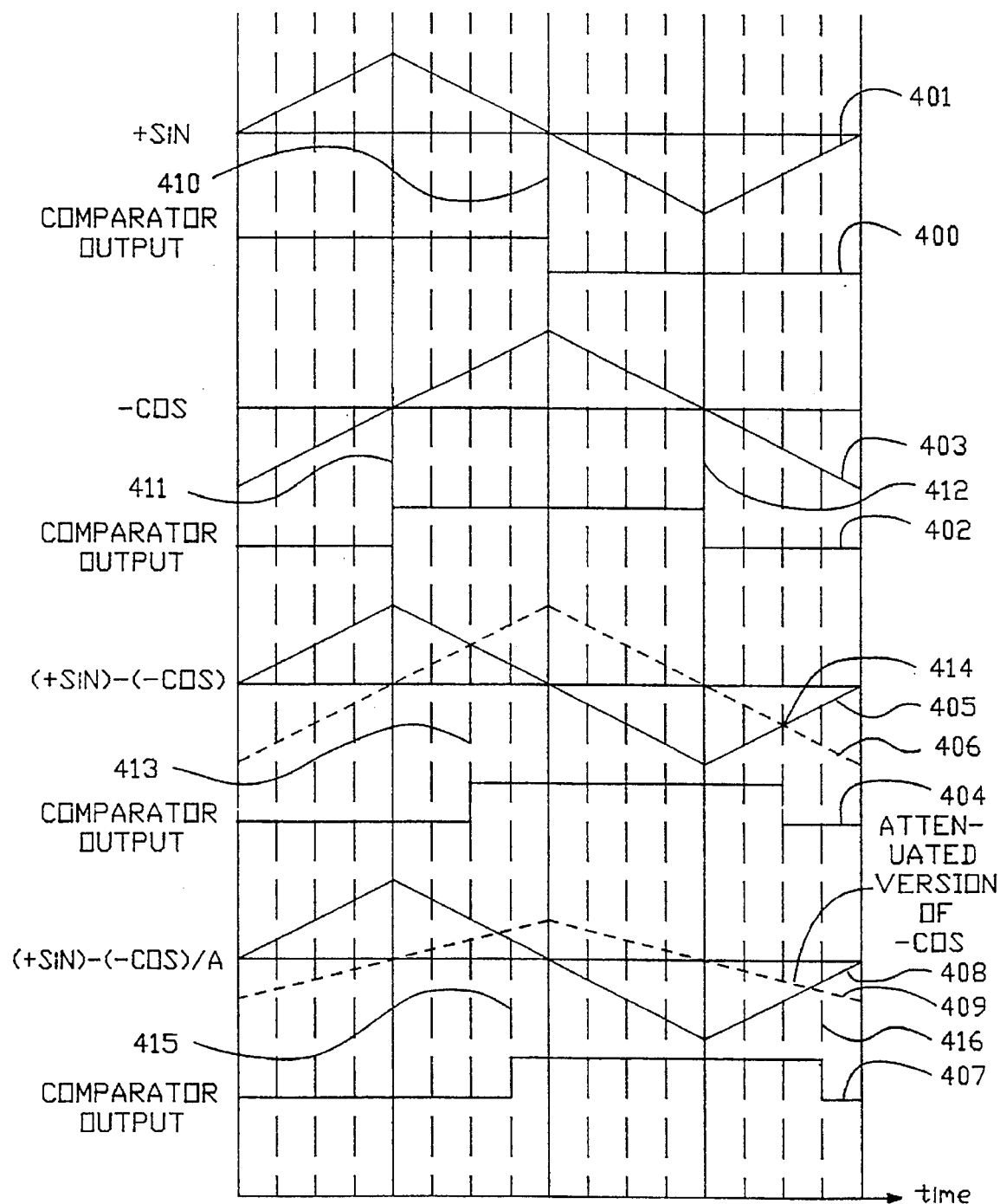
FIG. 4 is a timing diagram illustrating the method for obtaining different clock phases using weighted versions of triangle waveforms.

FIG. 4 is a timing diagram illustrating the method of obtaining different clock phases by using weighted versions of triangle waveforms. In FIG. 4, four representative clock buffer 62-X outputs are shown, including a reference clock at trace 400 which may correspond, for instance, the output of buffer 62-2 for a given time relative to the plus sine (+SIN) trace 401. A second buffer output on trace 402 is provided which is representative, for instance, of the output of buffer 62-6 in reference to the minus cosine (–COS) trace 403. Trace 404 is representative, for instance, of the output comparator 62-4 which is produced in response to the (+SIN) and (–COS) signals as illustrated at traces 405 and 406. Also, FIG. 4 illustrates the output of a comparator 62-1 on trace 407. This signal is generated in response to comparison of the (+SIN) minus (–COS)/A computation, as illustrated with respect to traces 408 and 409. As can be seen, the comparator outputs 400, 402, 404 and 407 represent clock signals shifted in phase by one sixteenth cycle.

The buffer output 400 is a reference clock which has a transition when the sine signal intersects with ground at point 410. The second reference clock shown in FIG. 4 at trace 402 has transitions at 411 and 412 at which the minus cosine trace crosses zero. The third trace 404 has transitions when the plus sine and minus cosine signals intersect at points 413 and 414. The final trace 407 shown in FIG. 4 has transitions when the plus sine and an attenuated version of minus cosine intersect at points 415 and 416.

Thus, with reference to FIG. 3, eight reference clock signals, 79-0 through 79-7, are produced, shifted in phase by one sixteenth cycle each. These eight reference clock signals can be inverted to produce sixteen signals, one for each sixteenth of a cycle of the quadrature wave generator 56.

In this embodiment, the eight reference clock signals 79-0 through 79-7 are coupled to a multiplexer 80, which is controlled by the select signal on lines 81 designated FILTER(0:2).

The reference clock signals 79-0 through 79-7 are also connected to respective analog latching comparators 82-0 through 82-7. The analog latching comparators 82-0 through 82-7 are clocked in response to the edge detection signals on lines 83 produced by the edge detection circuit 53. The analog latching comparators 82-0 through 82-7 store a state of the plurality of reference clock signals on a detected transition in the input data stream. This stored state information is supplied to digital decoding logic 84, an example of which is provided below with reference to FIGS. 13 and 14, which may be synchronized with the edge detection signals on line 83.

The output DECODER(0:3) of the digital decoding logic 84 is supplied through a recursive digital filter 85 in the preferred embodiment. One example of such filter is provided below with respect to FIG. 16. The output FILTER (0:3) of the recursive digital filter, which is also clocked by the edge detection signals on line 83, includes the select signal FILTER (0:2) on line 81, and the invert/no-invert signal (FILTER(3)) on line 86. The output of the multiplexer 80 is supplied to the differential exclusive OR gate 87. The opposite input of the exclusive OR gate 87 includes the invert/non-invert signal on line 86. The output of the exclusive OR gate is the recovered clock signal on line 88 which is used to clock the analog latching comparator 54 to recover the data stream. The differential current mode logic signals on lines 88 and 89 are converted to a single ended format, such as TTL in translators 90 and 91, respectively.

Figure 5:
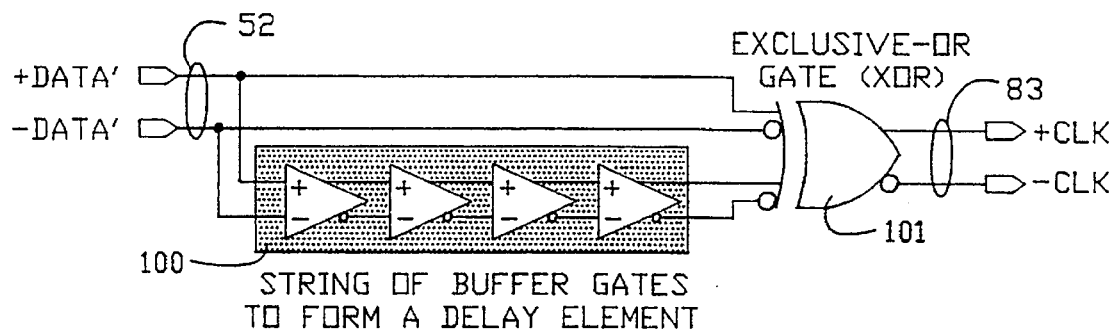
FIG. 5 is a schematic diagram of the edge detection circuit used in the embodiment of FIG. 3.

FIG. 5 illustrates one embodiment of an edge detector for use with the system of FIG. 3. The edge detector receives the differential data input on lines 52. A string 100 of buffer gates, four in the embodiment illustrated, form a delay element. The output of the string 100 of buffer gates is coupled to an exclusive OR gate 101. The other input to the exclusive OR gate 101 is the differential data signal on line 52. This produces a train of pulses on line 83. A more preferred system uses a circuit which triggers on first positive edge and does not retrigger until the following negative edge, such as a bounce-less switch.

Figure 6:
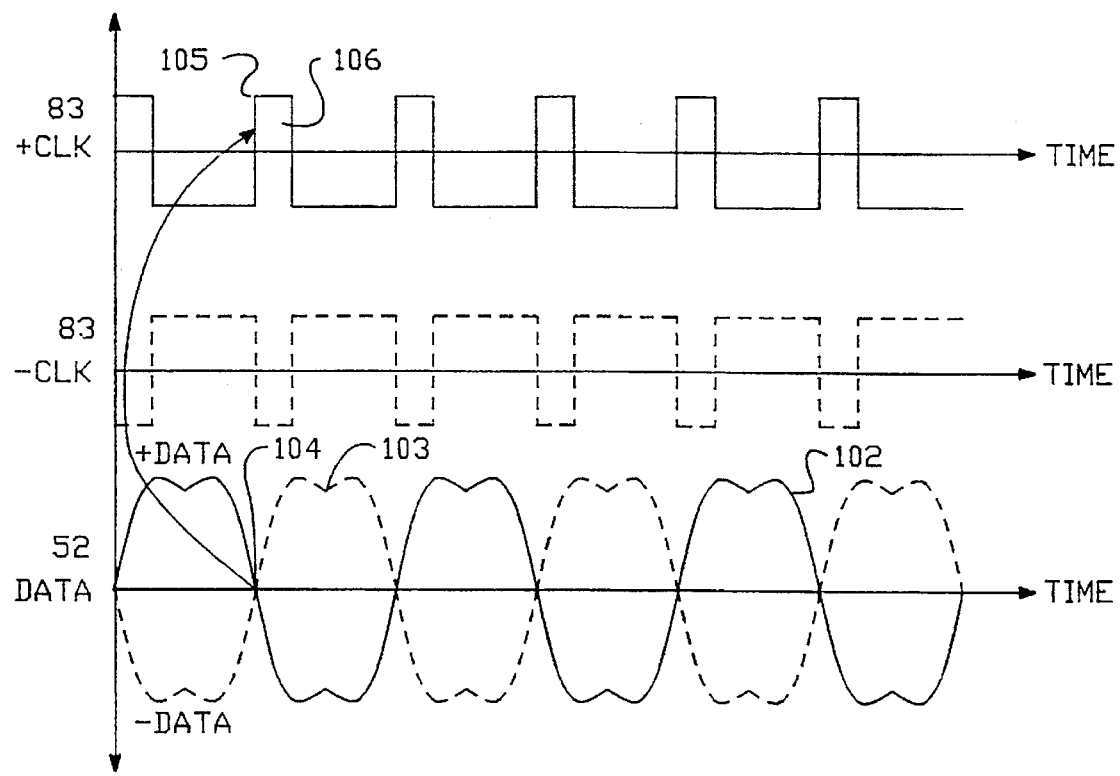
FIG. 6 is a timing diagram illustrating the edge detector outputs.

FIG. 6 illustrates the generation of the signal on lines 83 in response to an input data stream on lines 52 (trace 102). In the example shown, there is a transition for every clock period. It will be recognized that in an actual standard data stream, the actual number of transitions will vary widely. The differential data stream at trace 102 includes a positive data on trace 102 and the negative data on trace 103. The inputs to the exclusive OR gate 101 will become unequal during a data transition 104. Thus, the output of the exclusive OR gate 101 will pulse at edge 105. After the delay induced by delay element 100, the inputs to the exclusive OR gate 101 will become equal, causing a transition at line 106 back to a low clock. This pulse at transition 105 and transition 106 will occur for each transition in the input data stream as illustrated in FIG. 6.

Figure 7:
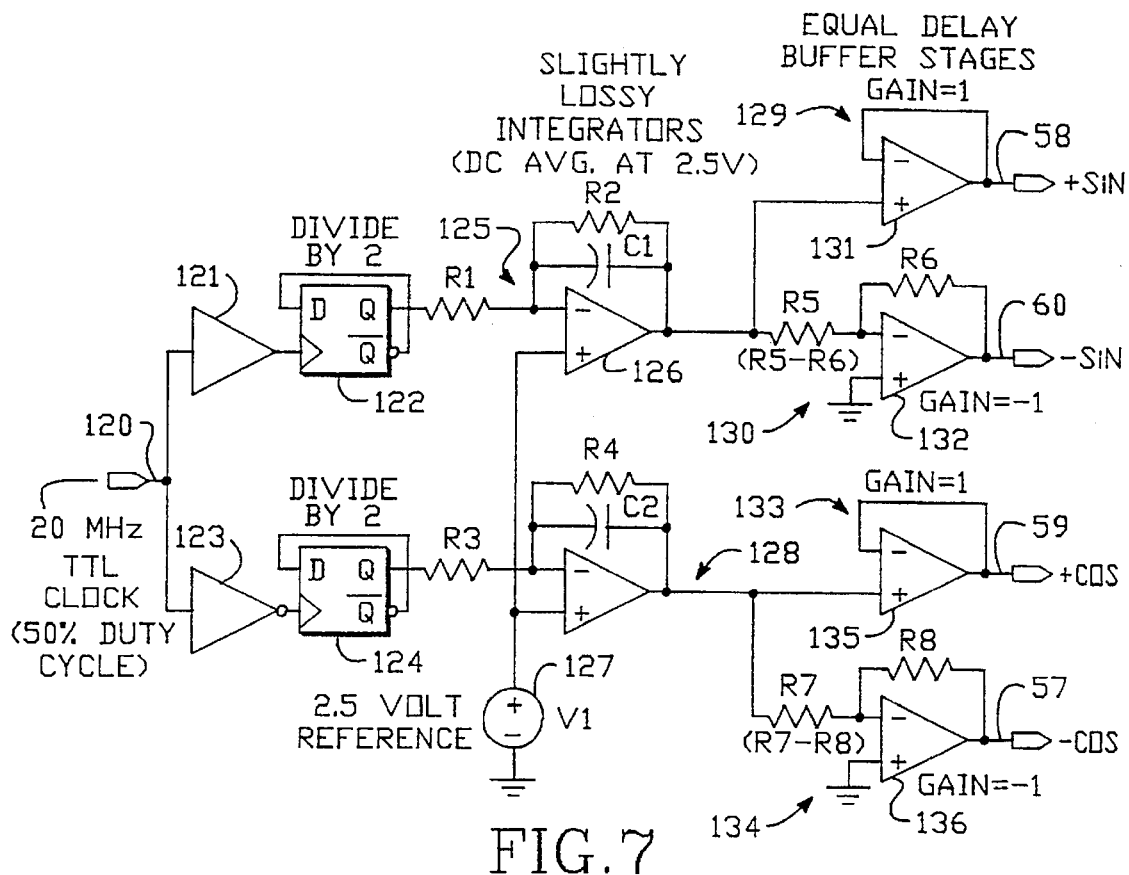
FIGS. 7 and 7A provide a schematic diagram and a timing diagram for a first embodiment of the triangle wave generator for use with the system of FIG. 3.
Figure 7A:
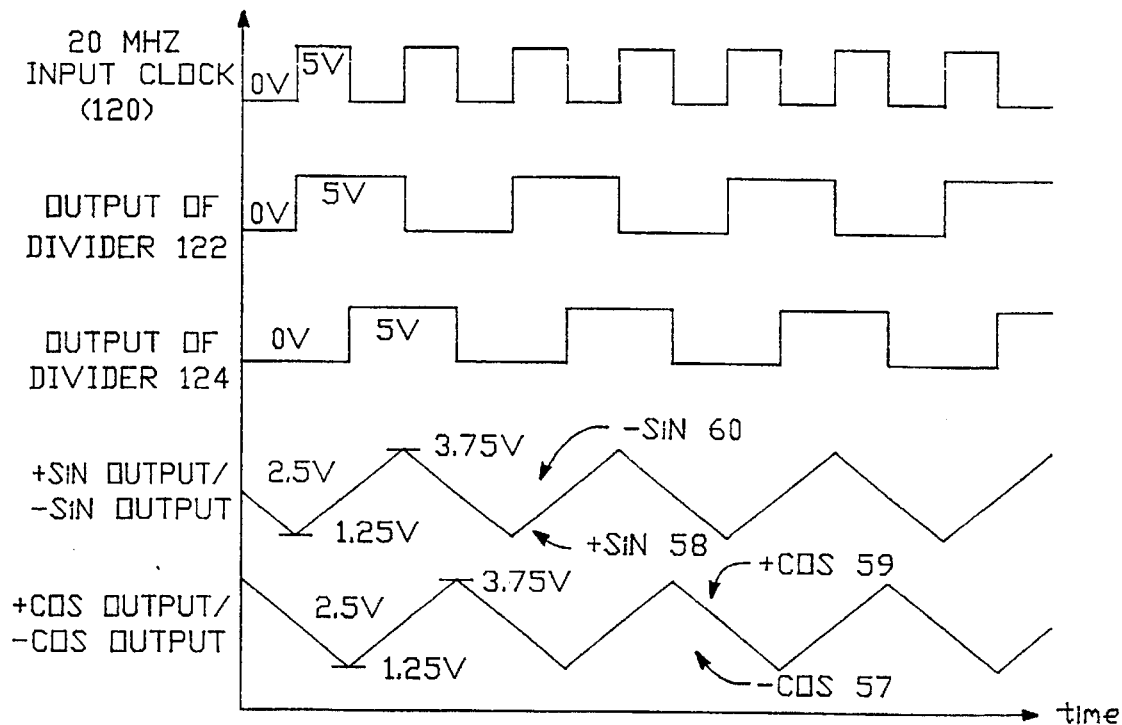
Figure 8:
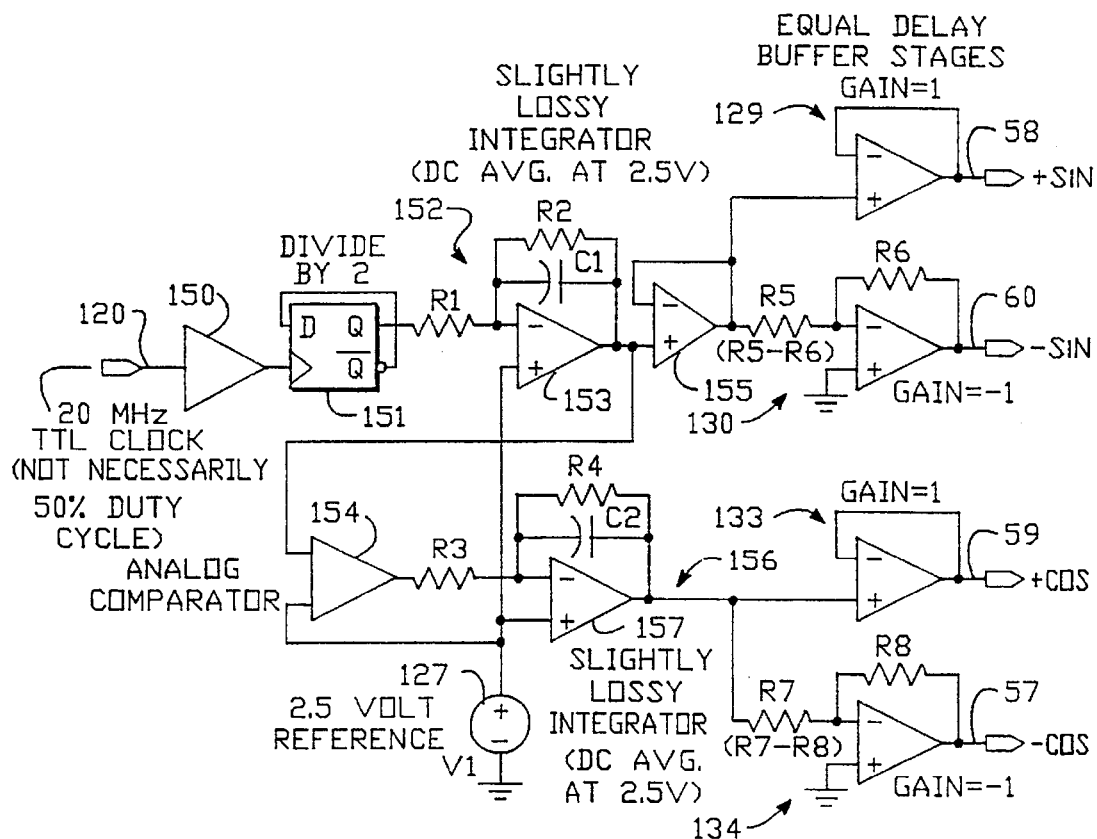
FIGS. 8 and 8A provide a schematic diagram and a timing diagram for a second alternative triangle wave generator.
Figure 9:
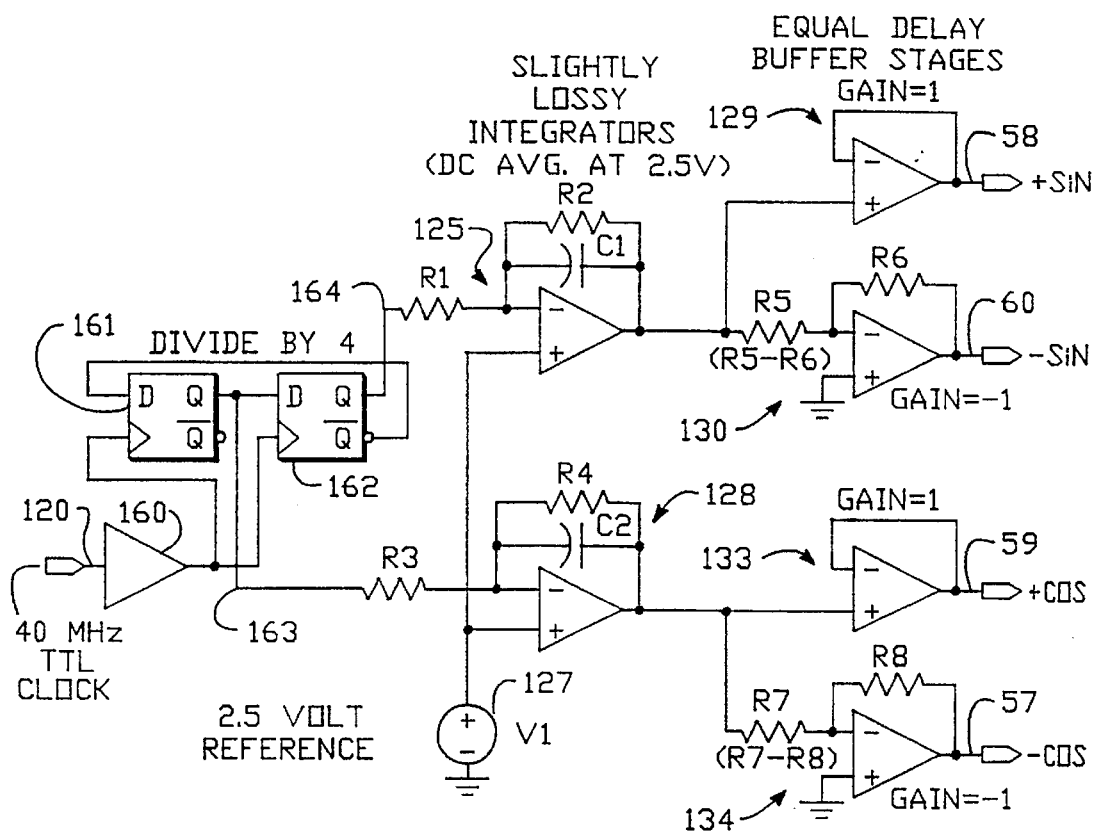
FIGS. 9 and 9A provide a schematic diagram and a timing diagram of a third alternative triangle wave generator.

FIGS. 7–9 with corresponding timing diagrams in FIGS. 7A–9A illustrate alternative embodiments of a triangle wave generator which could be used according to the present invention. It may be desirable to use sine wave generators, such as shown in FIGS. 20–23 for some applications. The first triangle wave embodiment is illustrated with respect to FIGS. 7 and 7A. The input includes a 20 MHz TTL clock with a 50% duty cycle on line 120. This signal is supplied through a non-inverting buffer 121 to a divide-by-two register 122, and through an inverting buffer 123 to a divide-by-two register 124. The output of the divide-by-two register 122 is supplied through resistor R1 as input to a slightly lossy integrator, generally 125. The integrator 125 includes a differential amplifier 126 having a positive input coupled to a 2.5 volt reference 127, and an inverting input coupled to resistor R1. The differential amplifier 126 has a capacitor C1 and a resistor R2 in feedback from its output to its inverting input. Slightly lossy integrators allow the output to assume a DC average value, avoiding closed-loop integrator implementation.

Similarly, the output of the divide-by-two register 124 is coupled across resistor R3 to a slightly lossy integrator, generally 128, which is implemented using a similar structure as integrator 125.

The output of integrator 125 is supplied to buffer stages 129 and 130 to produce the positive and negative sine outputs. The positive sine output is supplied through a unity gain amplifier 131 having its inverting input connected to its output. The negative sine output is supplied through inverting amplifier 132 which has resistor R6 in feedback between its output and inverting input, resistor R5 between integrator 125 and the inverting input, and its positive input connected to ground. R6 and R5 are set equal to provide a unity inverting gain to the amplifier. Thus, the signals on lines 58 and 60 of FIG. 3 are produced.

In a similar fashion, the output of the integrator 128 is supplied to buffer stages 133 and 134. Buffer 133 is a unity gain amplifier 135. Buffer 134 is an inverting amplifier 136 configured as described above. These amplifiers produce the positive cosine and negative cosine outputs on lines 59 and 57, respectively.

Figure 8A:
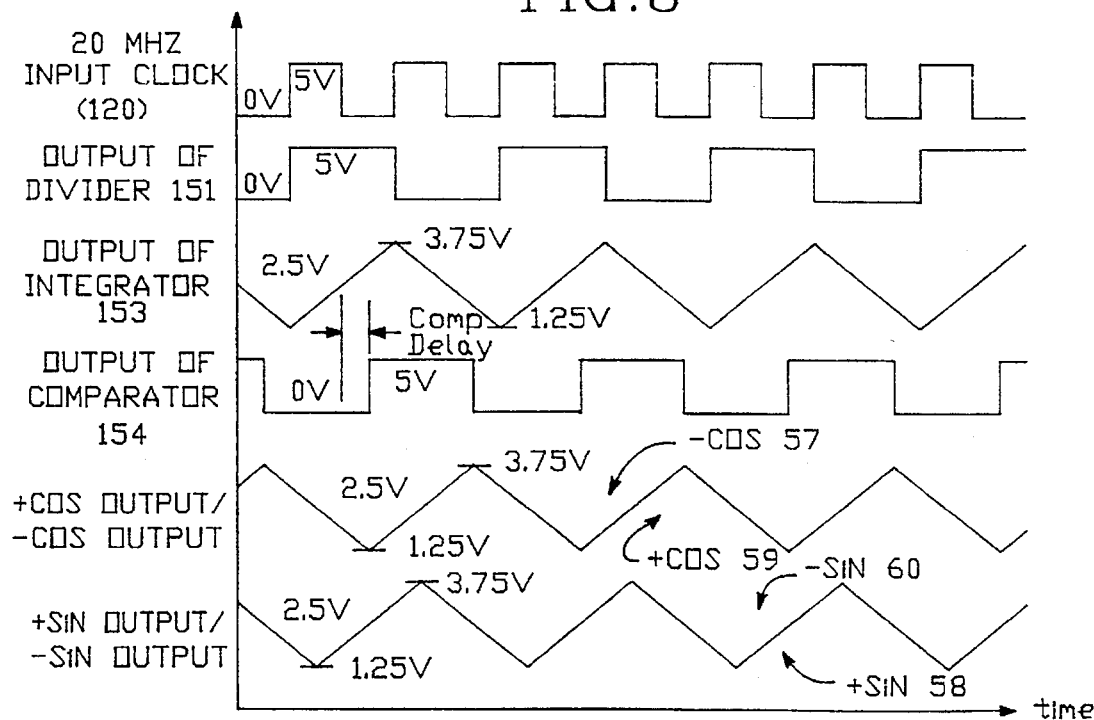

FIGS. 8 and 8A illustrate alternative embodiment of a triangle wave generator. The output stages are similar to those of FIG. 7 and are given like reference numbers, and not described again. The input is driven on line 120 by similar 20 MHz TTL clock but without the duty cycle limitation of FIG. 7. This input is supplied through a buffer 150 into a divide-by-two register 151 which generates a 10 MHz clock with a 50% duty cycle. The output of the divide-by-two register 151 is supplied through resistor R1 to a slightly lossy integrator 152. This integrator 152 is composed of differential amplifier 153 having capacitor C1 and resistor R2 in feedback, and having its positive input coupled to a 2.5 voltage reference 127. The output of the integrator 152 is coupled to a first analog comparator 154, and to a unity gain buffer 155. The opposite input of the analog comparator 154 is the 2.5 reference from source 127. The output of the comparator is a 50% duty cycle 10 MHz signal 90° out of phase with the output of the register 151. This signal is supplied through resistor R3 to slightly lossy integrator 156 composed of differential amplifier 157 having capacitor C2 and resistor R4 in feedback. The output of the unity gain buffer 155 is supplied to the equal delay buffer stages 129 and 130 to produce the positive and negative sine outputs on lines 58 and 60. The output of the integrator 156 is supplied to the delay stages 133 and 134 to produce the positive and negative cosine signals on lines 59 and 57.

Figure 9A:
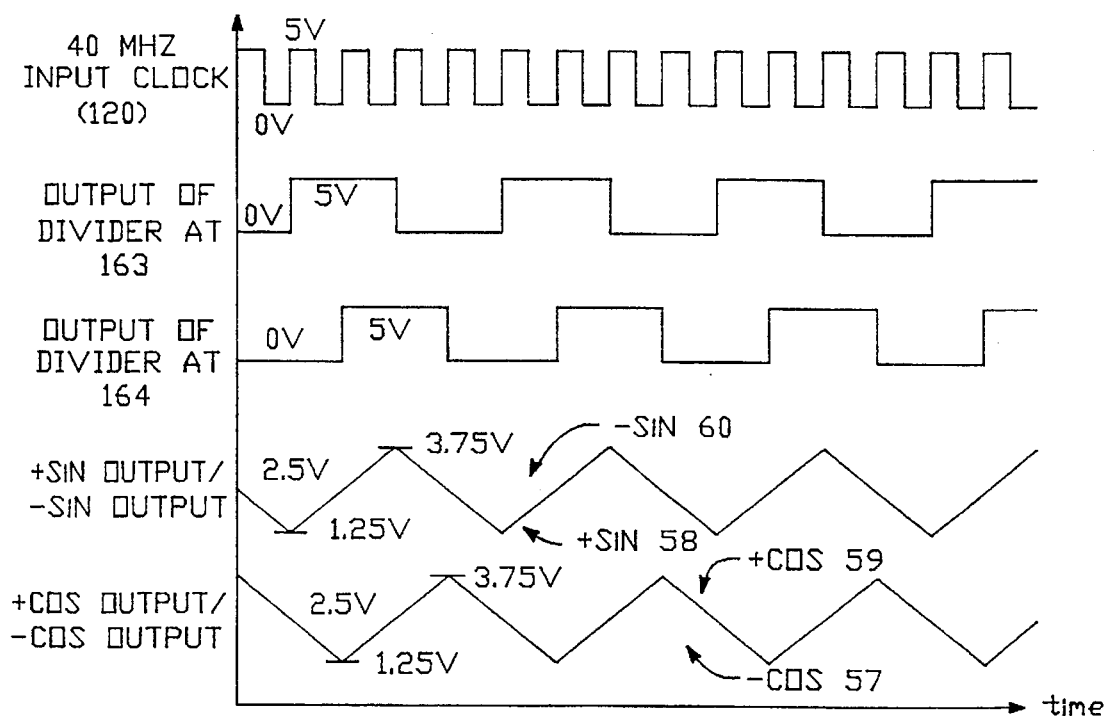

FIGS. 9 and 9A illustrate yet an alternative embodiment of the triangle wave generator according to the present invention. Again, this system relies on similar components as those in FIG. 7, which are given like reference numbers. The circuit differs by operating in response to a 40 MHz TTL clock on line 120 without duty cycle limitation. This clock is supplied through buffer 160 to a divide-by-four network comprising register 161 and register 162. This network has the clock from the output of buffer 160 coupled to the clock input of each register. The inverting output of register 162 is coupled in feedback to the D input of register 161. The output of register 161 is coupled to the input of register 162. Also, the output of register 161 is a 10 MHz, 50% duty cycle clock supplied on line 163 across resistor R3 to integrator 128. The output of register 162 is a 10 MHz, 50% duty cycle clock 180° out of phase with the output of register 161, supplied on line 164 across resistor R1 to the input of integrator 125. Integrators 125 and 128 drive the output delay stages 129, 130, 133, and 134 to produce the positive and negative sine, and positive and negative cosine signals on lines 57 through 60.

Essentially, in operation the lossy integrators produce a substantially linear ramp going up during one half-cycle, and down during the other half-cycle of each of the 10 MHz inputs supplied from the dividers. Each of the integrators operates 90° out of phase, and buffer delay stages are inserted in the triangle wave generator to insure that the output waveforms are properly aligned.

Figure 10:
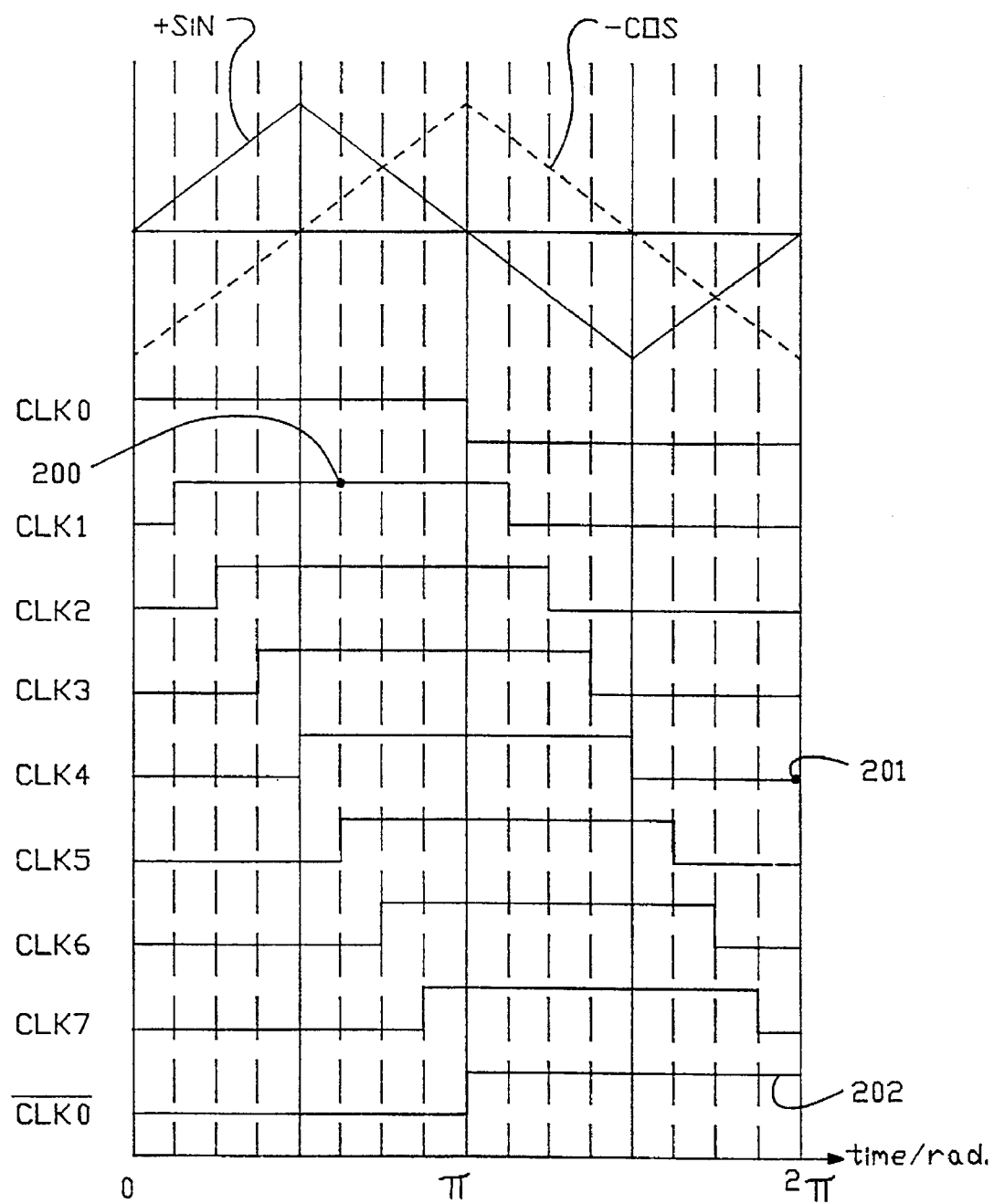
FIG. 10 is a timing diagram illustrating the triangle wave generator output and the outputs of the clock signal drivers.

FIG. 10 illustrates the relationship of the triangle wave signals on lines 57 through 60, and the reference clock signals on lines 79-0 through 79-7, as represented by the +SIN and −COS traces, and the CLK0 through CLK7 traces of FIG. 3. As can be seen, each of the reference clock signals is shifted in phase by $\pi/8$ radians. This allows for quantization of the phase of an input signal in 16 increments for a given clock cycle. Each of the 16 increments in phase within a single cycle of $2\pi$ radians, can be centered on either the true or complement version of at least one of the reference clock signals CLK0 through CLK7. For instance, a transition occurring at phase 200 can be centered on reference clock signal CLK1. Similarly, a signal transition occurring at phase equal to $2\pi$ can be centered as indicated by point 201 on the inverse of clock CLK4. The graph shows at trace 202 the inverse of CLK0, to provide and example of the result of inverting one of the reference signals 79-0 to 79-7.

Figure 11:
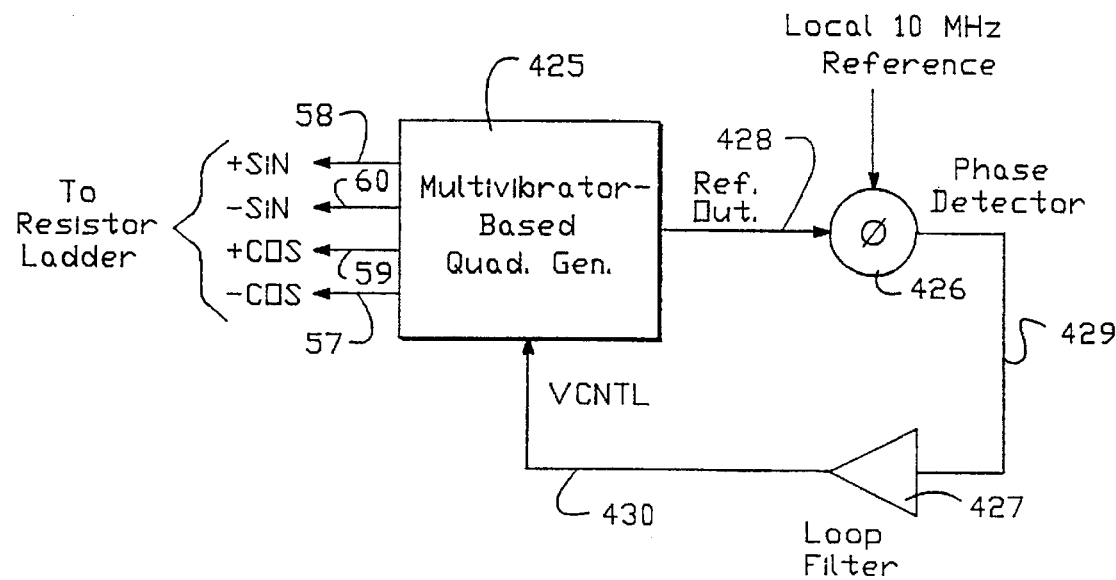
FIG. 11 is a simplified diagram of a multivibrator based quadrature generator used in a phase locked loop according to the present invention.

FIG. 11 illustrates yet another alternative embodiment of triangle wave generator for use with the system of FIG. 3. The embodiment of FIG. 11 is based upon the use of a multivibrator based quadrature generator 425 coupled into a phase locked loop, including a phase detector 426, and a loop filter 427. A multivibrator based quadrature generator 425 generates a reference signal on line 428 which is connected to a phase detector 426. The phase detector receives a local 10 MHz clock at reference input, and generates an output on line 429, representative of the phase difference between the output of the multivibrator based quadrature generator 425 and the 10 MHz local clock. A loop filter 427 supplies at its output a signal VCNTL on line 430 which is also supplied with a multivibrator based quadrature generator 425. The outputs of the multivibrator based quadrature generator 425 include the +SIN, −SIN, +COS, and −COS signals on lines 57–60 in the system of FIG. 3.

Figure 13:
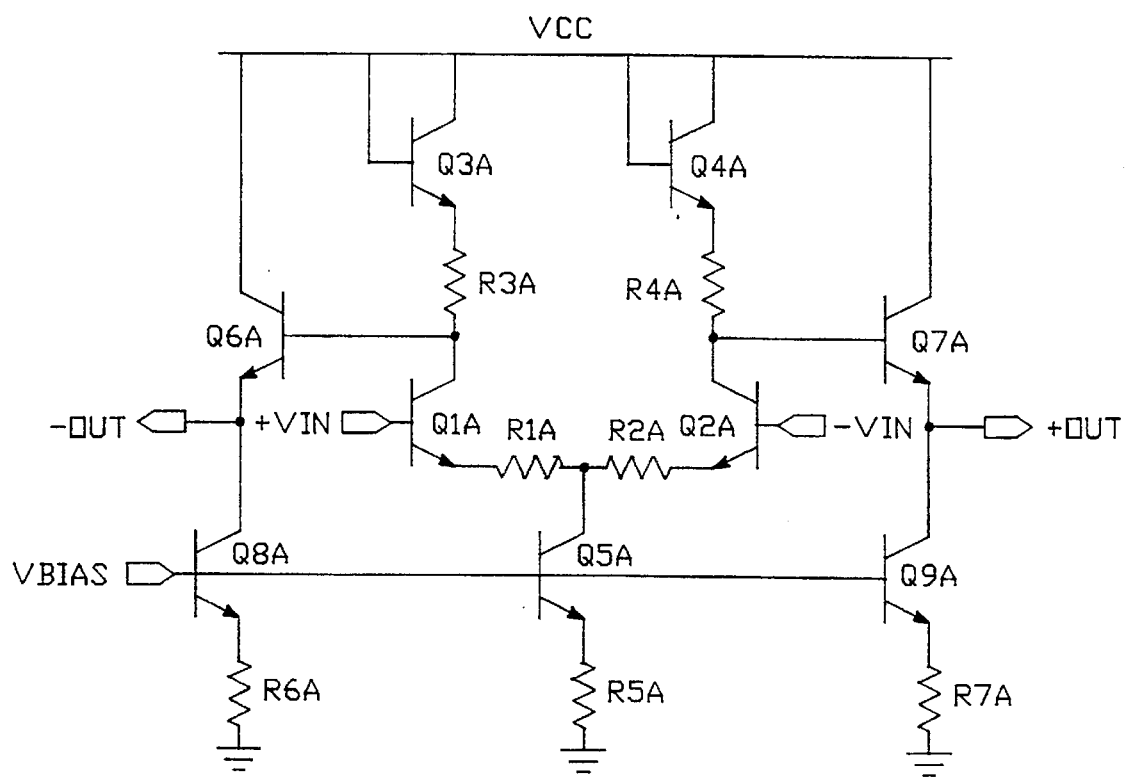
FIG. 13 is an electrical schematic diagram of a linear amplifier used in the circuit of FIG. 12.
Figure 12:
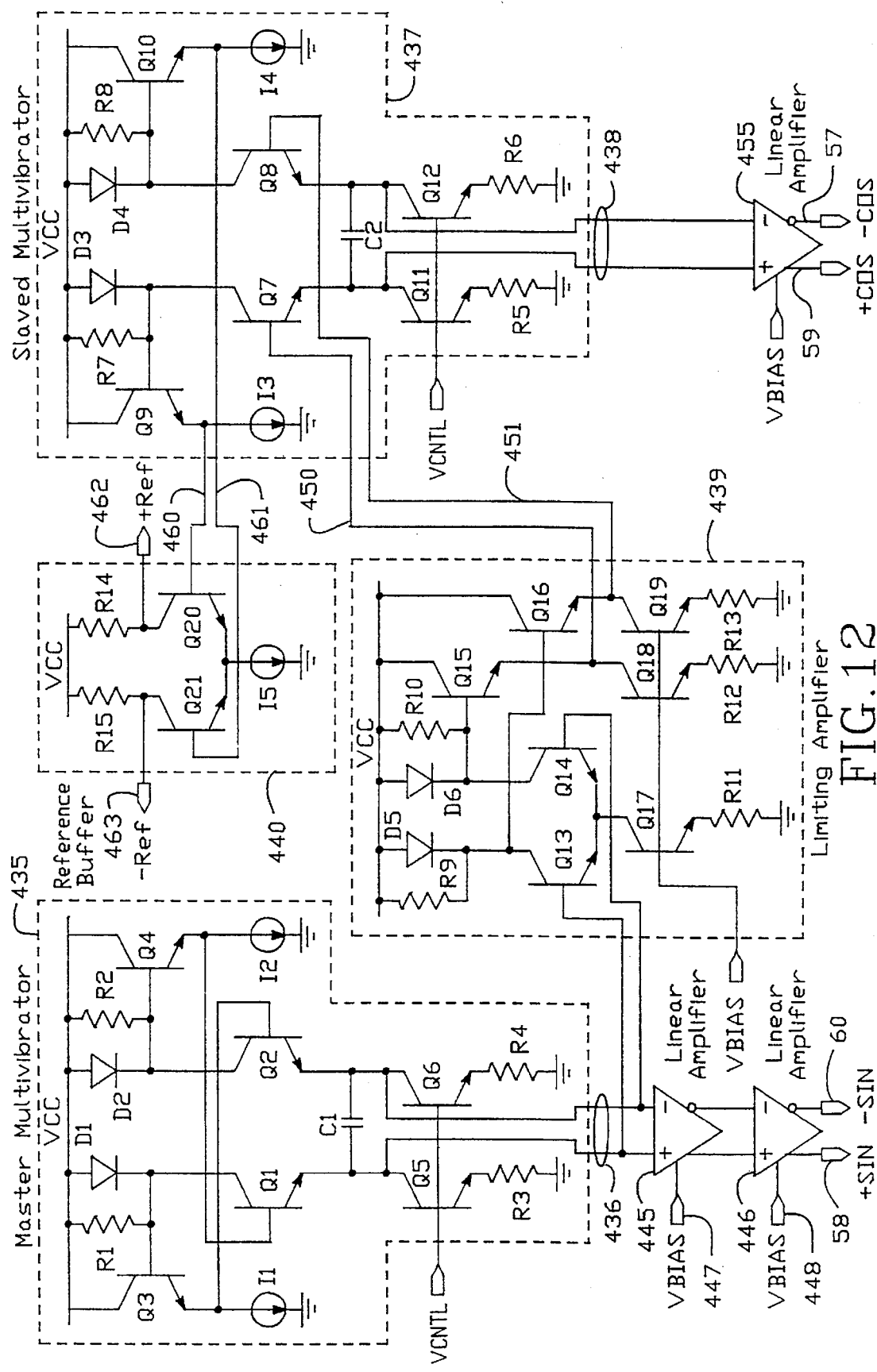
FIG. 12 is a circuit diagram for the multivibrator based quadrature generator used in the phase locked loop of FIG. 11.

A circuit schematic for the multivibrator based quadrature generator 425 is provided with respect to FIGS. 12 and 13. FIG. 12 illustrates the basic circuit structure including a master multivibrator 435 which generates triangle wave outputs on lines 436, a slaved multivibrator 437 which generates triangle wave outputs on lines 438, a limiting amplifier 439, and a reference buffer 440.

The multivibrator 435 is based upon bipolar transistors Q1 and Q2 which have their emitters connected across capacitor C1. The collector of transistor Q1 is connected to the cathode of diode D1. The anode of diode D1 is connected to the supply voltage VCC. Also, a resistor R1 is connected in parallel across the diode D1. The collector terminal of transistor Q1 is also connected to the base of transistor Q3, which has its collector coupled to VCC and its emitter connected to current source I1. The transistor Q2 is similarly connected, having its collector connected to the cathode of diode D2, the anode of which is connected to the supply voltage. Resistor R2 is connected in parallel with diode D2. The base of transistor Q4 is connected to the collector terminal of transistor Q2. The emitter of transistor Q4 is connected to the current source I2 and its collector is connected to the supply terminal VCC. The emitter of transistor Q3 is connected to the base of transistor Q2. The emitter of transistor Q4 is connected to the base of transistor Q1.

The emitter terminals, in addition to being coupled by capacitor C1, are connected to the collectors of respective transistors Q5 and Q6. The transistors Q5 and Q6 have their bases connected to a control signal VCNTL which is produced in the phase locked loop, as described with reference to FIG. 11. The emitters of transistors Q5 and Q6 are coupled across resistors R3 and R4 respectively to ground. The output of the multivibrator at the collector of transistors Q5 and Q6 consists of a triangle wave on lines 436. This signal is supplied through series linear amplifiers 445 and 446. These amplifiers receive bias signals VBIAS on lines 447 and 448. The output of linear output amplifier 446 is the +SIN and the −SIN signals on lines 58 and 60, respectively.

Also, the triangle waves on line 436 are connected to the limiting amplifier 439. Limiting amplifier 439 consists of the differential pair of transistors Q13 and Q14. The base of transistor Q13 receives the positive side of the triangle waves on line 436, while the base of transistor Q14 receives the negative side. The emitters of transistors Q13 and Q14 are connected through transistor Q17 and resistor R11 to ground. Transistor Q17 receives the signal VBIAS at its base. Collectors of transistors Q13 and Q14 are coupled across diodes D5 and D6 respectively to VCC. Resistors R9 and R10 are coupled in parallel with the diodes D5 and D6 respectively to the supply voltage VCC. Also, emitter follower Q15 is connected to the collector terminal of transistor Q14. The collector of transistor of Q15 is connected to the supply voltage VCC and its emitter is connected to line 450. Similarly, the collector of transistor Q13 is connected to the base of emitter follower transistor Q16. The collector of transistor Q16 is connected to the supply voltage VCC and its emitter is connected to line 451. The emitters of transistors Q15 and Q16 are connected to the current sources composed of transistors Q18 and Q19 having their bases connected to the VBIAS signal, and their emitters connected through resistors R12 and R13, respectively, to ground.

The signals 450 and 451 drive the slaved multivibrator 437. This multivibrator has a structure similar to the master multivibrator 435, and is based on the bipolar transistors Q7 and Q8 which have their emitters coupled together across capacitor C2. The collector of transistor Q7 is connected across diode D3 to the supply voltage. Resistor R7 is connected in parallel with the diode D3. The collector of transistor Q7 is connected to the base of Q9 which has its collector coupled to the supply voltage VCC and its emitter connected to the current source I3.

The collector of transistor Q8 is connected across diode D4 to the supply voltage VCC. Resistor R8 is in parallel with diode D4. The collector of transistor Q8 is also connected to the base of transistor Q10 which has its collector coupled to VCC and its emitter connected across current source I4 to ground.

The emitters of transistors Q7 and Q8 are connected through current sources composed of transistors Q11 and Q12 which have their bases coupled to the control signal VCNTL. Also, the emitters of transistors Q11 and Q12 are connected across resistors R5 and R6 to ground.

The output of the slaved multivibrator 437 is provided at the collectors of transistors Q11 and Q12, and drives lines 438 to linear amplifier 455. Linear amplifier 455 is biased by the signal VBIAS, and produces the +COS and −COS signals on lines 59 and 57, respectively.

The reference buffer 440 is driven by the signals on lines 460 and 461 which are produced at the emitters of transistors Q9 and Q10 respectively in the slaved multivibrator. Lines 460 and 461 are connected to the bases of the differential pair Q20 and Q21 respectively. The emitters of transistors Q20 and Q21 are connected through current source R5 to ground. The collectors of transistors Q20 and Q21 are connected resistors R15 and R14 respectively to the supply voltage VCC. The reference signals +REF and −REF are supplied on lines 462 and 463 back to the phase locked loop as described above with reference to FIG. 11.

In operation, the master multivibrator 435 produces triangle waves on line 436. These triangle waves are supplied to the limiting amplifier 439 which produces square waves on line 450 and 451. The square waves drive the slaved multivibrator 437 to produce triangle waves on line 438 which are shifted in time relative to the triangle waves on line 436. The linear amplifiers 445, 446 and 455 are used to address the timing of the triangle waves to produce the plus and minus sine signals and the plus and minus cosine signals.

The reference buffer 440 is used to produce a reference signal for the phase locked loop.

The linear amplifiers 445, 446 and 455 might be implemented as shown in FIG. 13. In FIG. 13, a linear amplifier is produced using the transistors Q1A and Q2A which have their emitters coupled through resistors R1A and R2A respectively to a common node. The common node is connected to the collector of transistor Q5A. The emitter of transistor Q5A is connected through resistor R5A to ground. The base of transistor Q5A is coupled to the bias signal VBIAS. The collector of transistor Q1A is connected through resistor R3A and diode connected transistor Q3A to the VCC terminal. Similarly, the collector of transistor Q2A is coupled through resistor R4A and diode connected transistor Q4A to the supply terminal VCC. The collector of transistor Q1A is connected to the base of emitter follower Q6A which has its collector connected to the supply terminal VCC and its emitter connected to an output terminal. Also, the emitter of transistor Q6A is connected to the current source transistor Q8A which has its base connected to the reference voltage VBIAS and its emitter connected through R6A to ground.

The collector of transistor Q2A is connected to the base of emitter follower Q7A which has its collector connected to the supply VCC and its emitter connected to an output terminal. The emitter of transistor Q7A is also connected through current transistor Q9A which has its base connected to the reference signal VBIAS and its emitter connected through resistor R7A to ground. For unity gain, the transistors Q1A through Q4A should be identical devices, and the resistors R1A through R4A should be equal in value.

Figure 14:
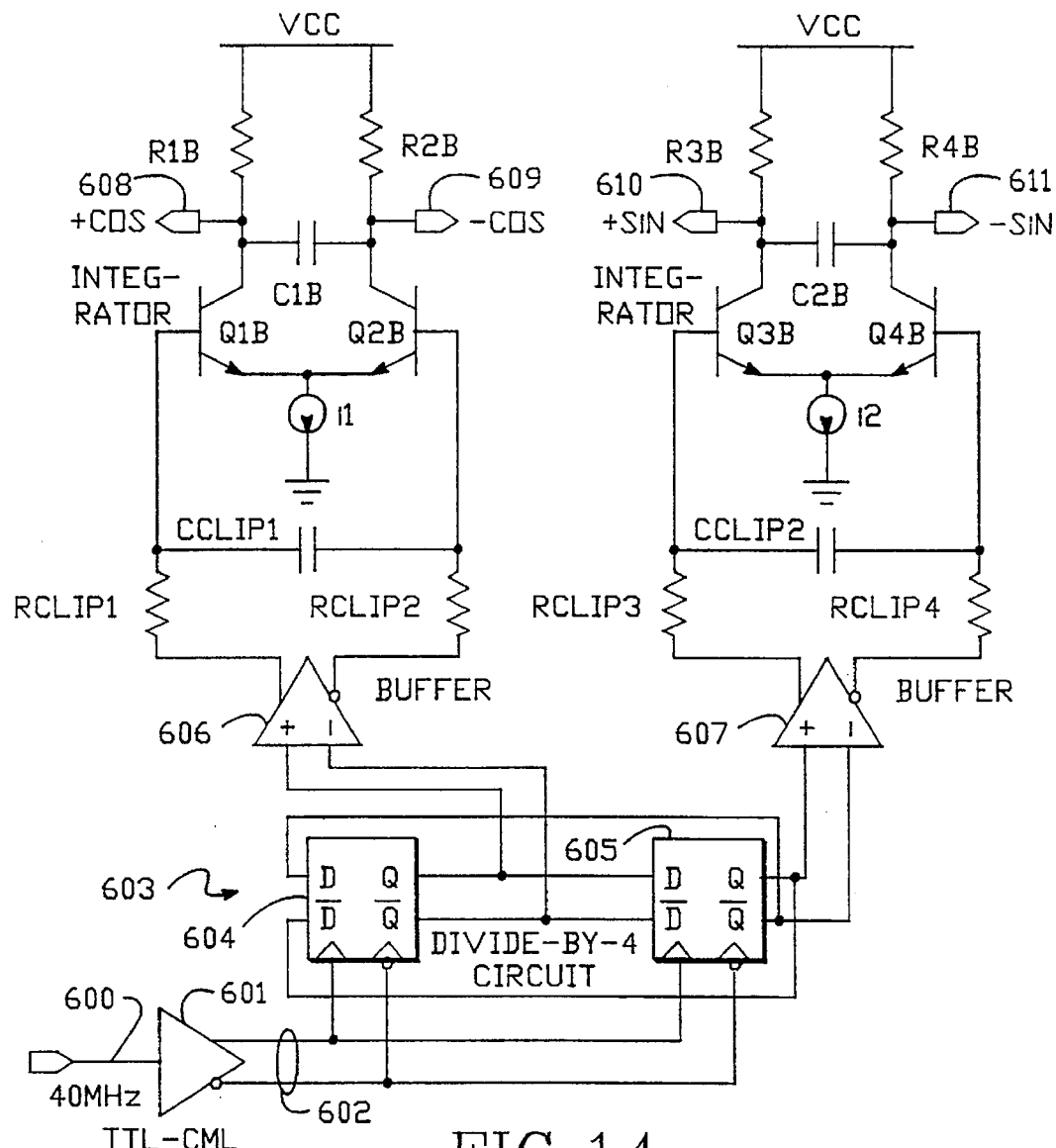
FIG. 14 is an electrical schematic diagram of another example triangle wave quadrature generator which may be used according to the present invention.

FIG. 14 provides an integrated circuit triangle wave generator adapted for integrated circuit technology. The circuit receives an input signal on line 600. This 40 MHz clock is supplied to a TTL-CML translator 601 which provides current mode logic signals on line 602. Lines 602 provide a clock for a divide by four circuit, generally 603, composed of a first flip-flop 604 and a second flip-flop 605. The D input to the first flip-flop 604 is provided at the Q bar output of the second flip-flop 605. The D bar input to flip-flop 604 is provided at the Q output of flip-flop 605. The Q output of flip-flop 604 is connected to the D input of flip-flop 605. The Q bar output of flip-flop 604 is connected to the D bar input of flip-flop of 605. The outputs of flip-flop 604 are connected to a buffer 606 which drives a first integrating circuit producing the plus and minus cosine signals. The outputs of flip-flop 605 are supplied through a buffer 607 which drives a second integrator producing the plus and minus sine signals. The positive output of buffer 606 is supplied through resistor RCLIP1 to the base of transistor Q1B. The negative output of buffer 606 is supplied through resistor RCLIP2 to the base of transistor Q2B. The emitters of transistors Q1B and Q2B are connected to current source I1. Also, the bases of transistors Q1B and Q2B are coupled by capacitor CCLIP1.

The collector of transistor Q1B is connected through resistor R1B to the supply VCC. The collector of transistor Q2B is connected through resistor R2B to the supply VCC. A capacitor C1B is connected between the collectors of transistors Q1B and Q2B. The +COS signal is supplied on line 608. The -COS signal is supplied on line 609.

The integrator which produces the plus and minus sine signals on lines 610 and 611 has an identical structure not redescribed here, except that it is driven 90° out of phase by buffer 607. The circuit of FIG. 14 is well suited to integrated circuit implementation.

Figure 15:
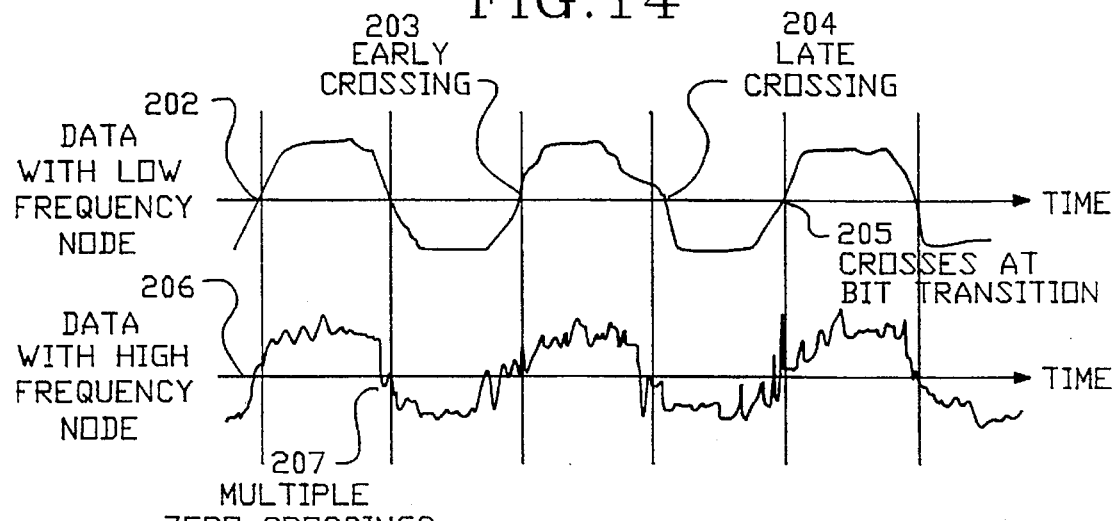
FIG. 15 is a diagram of NRZ data with noise and phase jitter used for explanation of the use of the recursive filter.

FIG. 15 illustrates a characteristic of a received data stream with respect to edge detection and phase quantization. In FIG. 15, a first trace 202 is illustrated, showing the data with low frequency noise superimposed. This type of data suffers errors known as an early crossing at point 203 and a late crossing at point 204. Also, some transitions will occur in phase with actual clock, as illustrated at point 205. FIG. 14 also includes a trace 206 indicating data with high frequency noise. This suffers the early and late crossing problem, as well as the possibility for multiple zero crossings at a given transition as illustrated at point 207. Because of the early crossing, late crossing, and multiple crossing problem, it is desirable to include a filter at the output of the decoder circuit. Thus, as illustrated in FIG. 16, a recursive digital filter is utilized to minimize the effect of phase jitter in a received data stream.

Figure 16:
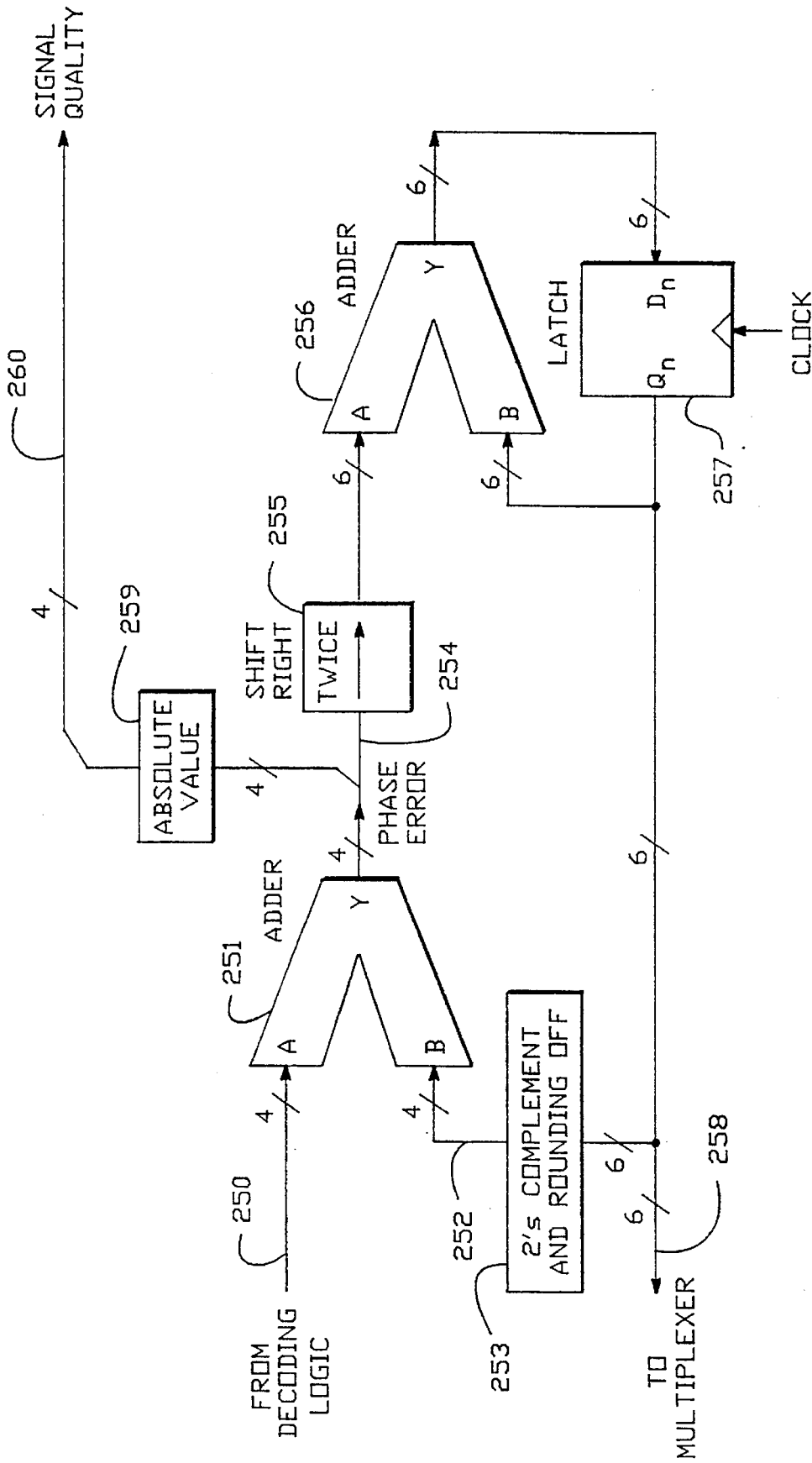
FIG. 16 is a schematic diagram of a recursive digital filter for use with the system of FIG. 3.

As shown in FIG. 16, the complementary outputs of the decoding logic are supplied on line 250 to the input of adder 251. The second input to the adder 251 is supplied on line 252 form the output of the 2's complement and the rounding off circuit 253, which receives its input as feedback from the filter loop. The output of the adder supplied on line 254 as a phase error signal to a dividing circuit 255, which operates by shifting the phase error signal 254 to the right twice. The output of the dividing circuit 255 is connected to the input of a second adder 256. The second input to the adder 256 is supplied from the output of a latch 257 in feedback in the loop. The input of the latch 257 is supplied from the output of the adder 256.

Also, the output of the latch 257 is supplied as input the 2's complement and rounding off circuit 253 to complete the loop of the recursive filter. Furthermore, the output latch 257 is supplied on line 258 back to the multiplexer to control selection of the reference clock signal.

An absolute value for the phase error is sampled by the absolute value circuit 259 and provides a signal quality signal on line 260.

A variety of other digital filter designs could be used as suits the needs of a particular design, including higher order designs, such as a second order or third order recursive digital filter. Also, it may be desirable to widen the recursive filter to more than 4 bits to avoid truncation errors. Adaptation of the filter will be determined based on a particular environment using the invention.

Figures 17, 18:
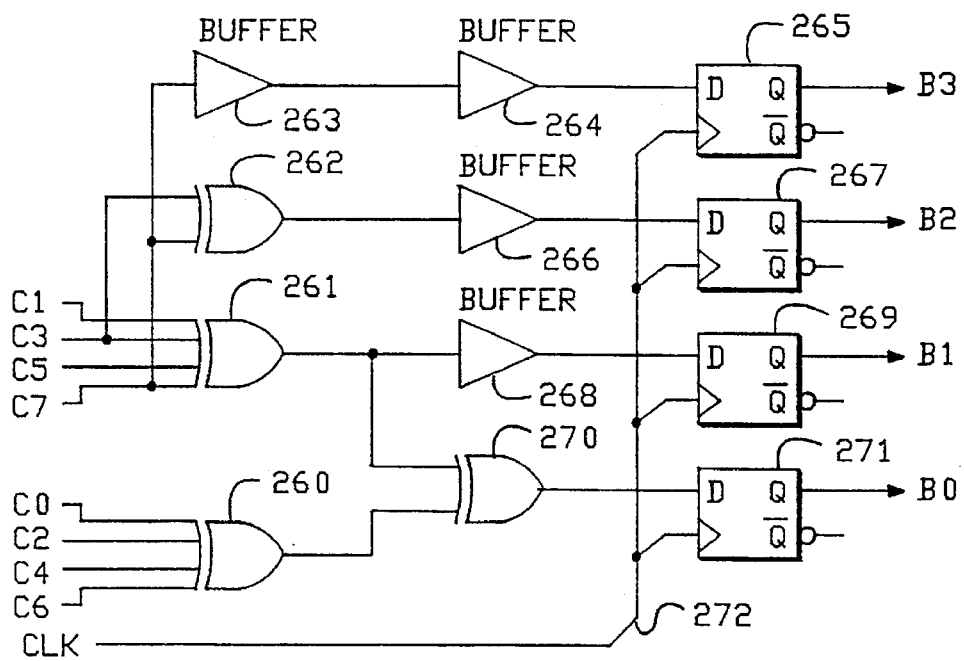
FIG. 17 is a decoding logic table for the decode logic of the system of FIG. 3.
FIG. 18 is a logic diagram for a decoder implementing the decoding logic table of FIG. 17.

The implementation of the decoder 84 of FIG. 3 is illustrated in FIGS. 17 and 18. FIG. 17 illustrates the logic table executed by the decoder. This logic table is believed self-explanatory where the inputs include C0 through C7 corresponding to the outputs of latching comparators 82-0 through 82-7. The outputs B0 through B3 correspond to the signals DECODE(0:3) generated at the output of the decoding logic 84.

FIG. 18 illustrates one logic circuit implementation realizing the logic table of FIG. 17. Note that in FIG. 18, all data inputs are shown as single-ended even through differential logic is used throughout in a bipolar embodiment. The decoder can also be designed to be insensitive to metastable states of comparators. In this embodiment, signals C0, C2, C4, and C6 are supplied as inputs to exclusive OR gate 260, which performs the function C0 XOR C2 XOR C4 XOR C6. Signals C1, C3, C5, and C7 are supplied as inputs to exclusive OR gate 261. Signals C3 and C7 are supplied as inputs to exclusive OR gate 262. Signal C7 is supplied to buffer 263. The output of buffer 263 is supplied through buffer 264 to the data input of register 265. The output of exclusive OR gate 262 is supplied through buffer 266 to the data input of register 267. The output of exclusive OR gate 261 is supplied to buffer 268 to the data input of register 269. It is also supplied as input to exclusive OR gate 270. The second input to exclusive OR gate 270 is the output of exclusive OR gate 260. The output of exclusive OR gate 270 is supplied to the data input of register 271. Each of the registers 265, 267, 269, and 271 is clocked by the edge detection signal on line 272. A wide variety of other logic implementations for the decoder could be utilized. The logic decoder of FIG. 18 relies on "thermometer code" output of comparators, to achieve reduction of complexity, high speed, and low power consumption.

Figure 19:
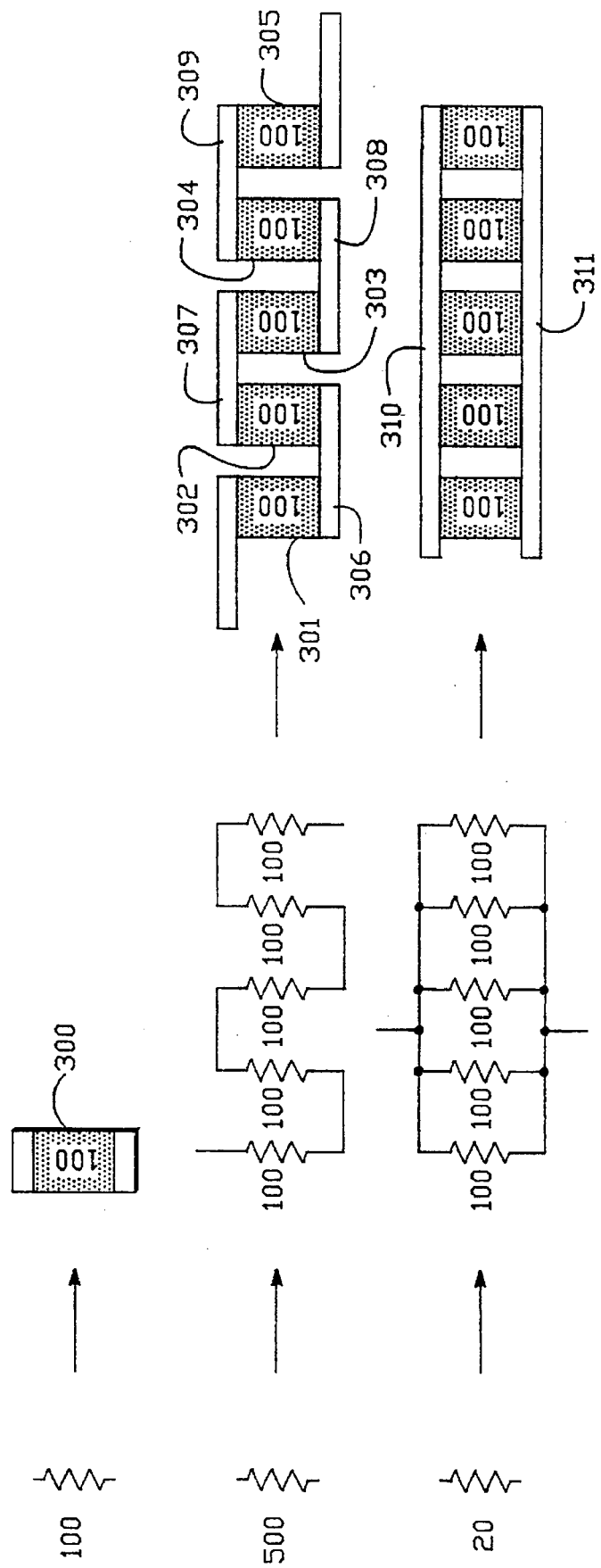
FIG. 19 illustrates the use of resistor ratioing in integrated circuit design for implementation of a preferred embodiment of the present invention.

As mentioned above, in the preferred system, the clock recovery circuit of FIG. 3 is implemented on a single integrated circuit. The resistor ladder is implemented using monolithic resistor technology which is largely immune to process and temperature variations. Using this technology, a plurality of uniform resistive strips are laid down in the masking process. Metallization is used to interconnect the uniform strips to provide a scaled resistive value with great precision and repeatability. For instance, as illustrated in FIG. 19, to implement a 100 Ohm resistor, a single uniform strip 300 is utilized. To implement a 500 Ohm resistor, a sequence of five 100 Ohm resistors is utilized in series by interconnecting the uniform strips 301 through 305 by metallization 306, 307, 308, and 309. Similarly, to implement a 20 Ohm resistor, 5 uniform strips are coupled in parallel by metallization 310 and 311. This allows particularly accurate resistor divider circuits because the absolute value of the resistance of a particular element is not particularly critical, while the relative resistance of two similar strips is important. This precise relative value of the monolithic resistor technology allows for precise control of the phase of the reference clock signals, which could not be obtained readily using a capacitive technique, as is common in the prior art. These resistors may also be used in the multivibrator quadrature generator and in other circuits.

As mentioned above, in some embodiments, such as higher frequency embodiments, it may be desirable to generate sinusoidal reference waves rather than triangle shaped. To do so, it is necessary to generate sine waves which are very close to 90 degrees out of phase with respect to one another. FIGS. 20 through 23 illustrate a number of circuits which could be used for this purpose.

FIG. 20 shows a "rat-race coupler" which has a first port 500 and a second port 501. The first port receives an input sine wave, while the second port 501 is isolated and coupled to a termination resistor 502. The rat-race coupler is based on a square having a first transmission line 503, a second transmission line 504, a third transmission line 505, and a fourth transmission line 506, each one quarter wavelength long. The intersection of the first and second transmission lines provides output port three 507. The second output is generated at the intersection of the second and third transmission lines at port four 508. The sine waves at port 3 and port 4 are 90° and 180°, respectively, shifted in phase with respect to the input sine wave.

FIG. 21 illustrates the use of a high pass filter and a low pass filter to generate outputs that are 90 degrees out of phase. In FIG. 21, the input is provided on node 515. A high pass filter includes a first capacitor 516 coupled from node 515 to node 517, and a second capacitor 518 coupled from node 517 to output 519. An inductor 520 is coupled from node 517 to ground.

The low pass filter includes a first inductor 521 connected between the inputs 515 and node 522. A second inductor 523 is connected from the node 522 to output 524. Capacitor 525 is connected from node 522 to ground. The high pass filter generates an output at +45 degrees phase at node 519, and the low pass filter generates an output at −45 degrees phase at node 524.

FIG. 22 is another embodiment of the low pass/high pass filter circuit for generating the 90 degrees phase shifted signals. In this embodiment, the input is supplied on line 530. The low pass filter includes resistor 531 in series with capacitor 532. The node 533 between the resistor 531 and the capacitor 532, supplies an output at +45 degrees phase. The high pass filter is based on capacitor 534 in series with resistor 535. The output 536 at the node between the capacitor 534 and the resistor 535 generates a sine wave −45 degrees in phase.

FIG. 23 shows yet another embodiment of a circuit for generating sine waves 90 degrees out of phase with respect to one another. This circuit includes the first port 540 and a second port 541. The first port receives the input sine wave, and the second port is isolated and connected to a termination resistor 542. The first port 540 is coupled through inductor 543 to the output port 544. The second port 541 is connected through inductor 545 to output port 546. Inductors 543 and 545 are magnetically coupled. A capacitor 547 is connected from ground to the first port 540. A capacitor 548 is connected from the first port to the second port. A capacitor 549 is connected from the second port 541 to ground. Also, a capacitor 550 is coupled from ground to the third port 544. Capacitor 551 is connected from the third port 544 to the fourth port 546. Capacitor 552 is connected from the fourth port 544 to ground. This circuit induces an output on the third port 544 which is 90 degrees phase shifted with respect to the input on port 540. Also, the output on the fourth port 546 is shifted by 180 degrees with respect to the input on line 540.

Accordingly, four representative examples of circuits which can be used to generate sinusoidal reference waves of substantially equal amplitude which are 90 degrees out of phase with respect to one another are shown. In order to adapt the circuit of FIG. 3 to use a sinusoidal reference wave generator in place of triangle wave generator 56, the resistor ladder 61 would be implemented using a different set of resistor values to set the trip levels of the various comparators appropriately.

In sum, the present invention provides a receiver for non-phase encoded data, such as NRZ data, which might be transmitted in a bandwidth limited, wireless communication medium. The invention relies on an accurate local clock at each receiver. This local clock is accurate enough to maintain the rising clock edge to within a fraction of a bit period of the ideal midperiod sample point of the NRZ data, even when there has not been a data transition for many clock periods. The phase of the local reference is adjusted so that its positive edge is the line with the center of the NRZ data bit period. The clock recovery circuit with a recursive filter takes advantage of the alternating bit pattern in the preamble of a typical transmitted packet to accurately set the clock phase with reference to the data. The recursive filter reduces the effects of jitter and noise on later processing transitions. Subsequent data transitions are used to fine tune the phase estimate. Since each subsequent transition may contain jitter or noise, the clock circuit is designed in such a way as to not respond immediately to each transition. Instead, each subsequent transition is processed using filtering technology to move the clock phase closer to its correct value. In effect, the clock recovery circuit takes a snapshot of the incoming data with respect to the reference clock on each transition. This snapshot is held indefinitely, until other data transitions occur. Since the reference clock at the receiver is guaranteed to be very close in frequency to the reference clock at the transmitter, holding a snapshot of the data phase will remain valid over many bit periods. This snapshot is used to select a phase shifted version of the reference clock that has a rising edge closest to the center of the data period. Using filtering, the circuitry is able to average a few snapshots to get a better idea of what the phase reference clock should be, such as in the case of noisy data. This prevents any one data transition from changing the reference clock phase by very much.

The recursive filter may not be suitable for environments which require very fast lock. However, in an environment including a preamble used for clock synchronization, the filter will produce an accurate phase signal before the end of the preamble, and provide a noise immune reference clock.

The ability to recover clock from NRZ or other non-phase encoded data is critical to a wireless transmission environment, where bandwidth is critical. Standard Manchester encoding, or other phase encoding techniques require twice the bandwidth to transmit, because of the insertion of the clock with the data. This utilization of bandwidth greatly reduces the effective data rate that can be transmitted through an allocated bandwidth in the wireless medium.

In the embodiments described above, a bipolar integrated circuit process using current mode logic has been assumed. Using other processes, such as CMOS, might require single ended logic. In either case, the circuit is conceptually the same.

Accordingly, a wireless data receiver with clock and data recovery circuitry capable of acquiring clock from a non-phase encoded data is provided.

The circuit includes at least the following advantages over the prior art:

1. Fast acquisition: The circuit achieves clock synchronization on as little as one clock transition (with the recursive digital filter bypassed) in a high signal-to-noise environment. Alternatively, a number of data transitions can be averaged to get a more accurate idea of the true phase of recovered clock when operating in a low signal-to-noise environment.

2. No Manchester encoding required: Unlike other Ethernet clock recovery circuits, the present circuitry does not require data to be Manchester encoded. This allows use of NRZ data in a wireless LAN resulting in one-half the RF modulation bandwidth for a given data rate.

3. No phase locked loop required: This clock recovery circuit is not based on a phase locked loop. Phase locked loops suffer long settling times to achieve lock, have relatively high parts count, and require high gain operational amplifiers. High gain operational amplifiers can be difficult to build in some integrated circuit processes. One exception is found in the quadrature generator of FIG. 11. However, in this circuit, the phase locked loop does not need to follow a varying signal, and can be a simple design.

4. No analog delay cells required: Analog delay cells tend to have a very narrow range of operation. In other words, the delay provided by such cells is adjustable over only a small range. This limits the maximum and minimum frequency of operation. Analog delays, especially long delays, are also difficult to do with bipolar integrated circuit processes.

5. Reduced complexity: The present circuit is simpler than similar prior art technology, such as the Bazes, et al., reference above, and results in lower power dissipation, size, and cost.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An apparatus for receiving transmitted, non-phase encoded serial data from a communication medium, comprising:
   a receiver adapted to produce a local, non-phase encoded serial data stream from the transmitted serial data;
   a local clock;
   data and clock recovery circuitry, connected to the receiver and the local clock, to produce a recovered clock signal and recovered data signal from the local, non-phase encoded serial data stream, including resources which produce the recovered clock signal in response to the local clock and transitions in the local data stream, and which produce the recovered data stream in response to the local, non-phase encoded serial data stream and the recovered clock signal; and
   reference clock generation circuitry, including:
      a reference generator responsive to the local clock to generate a first reference wave and
      a second reference wave out of phase relative to the first reference wave; and
      a plurality of reference clock generators which generate respective reference clock signals in response to the first reference wave and second reference wave, each of the reference clock generators generating a reference clock sisal having a phase determined by relative amplitudes of the first and second reference waves; and
   clock selection circuitry, having inputs coupled to the plurality of reference clock generators, and to select a reference clock signal as the recovered clock signal.

2. The apparatus of claim 1, wherein the non-phase encoded serial data stream has a non-return-to-zero (NRZ) format.

3. The apparatus of claim 1, wherein the clock recovery circuitry comprises:
   an edge detection circuit which receives the local, non-phase encoded serial data stream and generates edge detection signals indicating high-to-low and low-to-high transitions in the local data stream;
   reference clock generation circuitry which, in response to the local clock, generates a plurality of reference clock signals shifted in phase with respect to one another; and
   phase quantizing circuitry, responsive to the edge detection signals and the plurality of reference clock signals, which generates a quantization signal indicating one of the plurality of reference clock signals having a particular phase relationship to the edge detection signals; and
   wherein the clock selection circuitry is responsive to the quantization signal to select the indicated reference clock signal as the recovered clock signal.

4. The apparatus of claim 3, wherein the phase quantizing circuitry includes:
   a plurality of memory elements, having respective inputs coupled to corresponding ones of the plurality of reference clock signals, which in response to the edge detection signal store a state of the plurality of reference clock signals upon a detected transition in the local data stream; and
   circuitry responsive to the stored state to supply the quantization signal.

5. The apparatus of claim 4, wherein the circuitry responsive to the stored state includes a decoder.

6. The apparatus of claim 5, wherein the decoder comprises a thermometer code reduced decoder.

7. The apparatus of claim 4, wherein the circuitry responsive to the stored state includes a filter which reduces effects of false transitions in the local data stream.

8. The apparatus of claim 4, wherein the circuitry responsive to the stored state includes:
   a digital decoder responsive to the stored state to produce a state decode signal; and
   a recursive digital filter which filters the state decode signal to produce the quantization signal.

9. The apparatus of claim 1, wherein the first and second reference waves comprise triangle waves one quarter cycle out of phase.

10. The apparatus of claim 1, wherein the first and second reference waves comprise sine waves one quarter cycle out of phase.

11. The apparatus of claim 1, wherein the communication medium is bandwidth-limited.

12. The apparatus of claim 1, wherein the communication medium is bandwidth-limited, wireless radio, and the receiver comprises a wireless radio receiver.

13. A clock recovery circuit for a data stream, comprising:

an edge detection circuit which receives the data stream and generates edge detection signals indicating high-to-low and low-to-high transitions in the data stream;

reference clock generation circuitry which generates a plurality of reference clock signals shifted in phase with respect to one another;

phase quantizing circuitry, responsive to the edge detection signals and the plurality of reference clock signals, which generates a quantization signal indicating one of the plurality of reference clock signals having a particular phase relationship to the edge detection signals; and clock selection circuitry, having inputs coupled to the plurality of reference clock signals, and responsive to the quantization signal to select the indicated reference clock signal; and wherein the reference clock generation circuitry includes:

a local clock input to receive a local clock;

a reference generator responsive to the local clock to generate a first reference wave and a second reference wave out of phase relative to the first reference wave; and a plurality of reference clock generators which generate respective reference clock signals in response to the first reference wave and second reference wave, each of the reference clock generators generating a reference clock signal having a phase determined by relative amplitudes of the first and second reference waves.

14. The clock recovery circuit of claim 13, wherein the reference clock generation circuitry includes:

a local clock input to receive a local clock;

circuitry, coupled to the local clock input, to produce the plurality of reference clock signals in response to the local clock, the plurality of reference clock signals, including N reference clock signals RCi, for i going from 0 to N−1, having substantially equal cycle times, reference clock signal RC0 having a particular phase $\phi$, and reference clock RCi having a particular phase $\phi+i\Delta$, where $\Delta$ is an increment in phase.

15. The clock recovery circuit of claim 14, wherein (N−1) times $\Delta$ is close to or equal to one half cycle time of the plurality of reference clocks.

16. The clock recovery circuit of claim 13, wherein the first and second reference waves comprise triangle waves one quarter cycle out of phase.

17. The clock recovery circuit of claim 13, wherein the first and second reference waves comprise sine waves one quarter cycle out of phase.

18. The clock recovery circuit of claim 13, wherein the phase quantizing circuitry includes:

a plurality of memory elements, having respective inputs coupled to corresponding ones of the plurality of reference clock signals, which in response to the edge detection signal store a state of the plurality of reference clock signals upon a detected transition in the data stream; and circuitry responsive to the stored state to supply the quantization signal.

19. The clock recovery circuit of claim 18, wherein the circuitry responsive to the stored state includes a decoder.

20. The clock recovery circuit of claim 19, wherein the decoder comprises a thermometer code reduced decoder.

21. The clock recovery circuit of claim 18, wherein the circuitry responsive to the stored state includes a filter which reduces effects of false transitions in the data stream.

22. The clock recovery circuit of claim 18, wherein the circuitry responsive to the stored state includes:

a digital decoder responsive to the stored state to produce a state decode signal; and a recursive digital filter which filters the state decode signal to produce the quantization signal.

23. The clock recovery circuit of claim 13, wherein the edge detection circuitry, reference clock generation circuitry, phase quantization circuitry, and clock selection circuitry are implemented on a single integrated circuit.

24. The clock recovery circuit of claim 23, wherein the reference clock generation circuitry includes:

a local clock input to receive a local clock;

a reference generator responsive to the local clock to generate a first reference wave and a second reference wave one quarter cycle out of phase relative to the first reference wave;

a monolithic resistor ladder receiving the first and second reference waves; and a plurality of reference clock generators, coupled to the resistor ladder, which generate respective reference clock signals in response to relative magnitudes of the first reference wave and second reference wave set by the resistor ladder.

25. The clock recovery circuit of claim 13, wherein the data stream comprises non-return-to zero (NRZ) encoded data.

26. An apparatus for receiving transmitted, non-phase encoded serial data from a wireless communication medium, comprising:

a receiver adapted to produce a local, non-phase encoded serial data stream from the transmitted serial data in the wireless communication medium;

a local clock;

edge detection circuitry which receives the local, non-phase encoded data stream and generates edge detection signals indicating transitions in the local data stream;

reference clock generation circuitry which, in response to the local clock, generates a plurality of reference clock signals shifted in phase with respect to one another;

phase quantizing circuitry, responsive to the edge detection signals and the plurality of reference clock signals, which generates a quantization signal indicating one of the plurality of reference clock signals having a particular phase relationship to the edge detection signals;

clock selection circuitry, having inputs coupled to the plurality of reference clock signals and an output, and responsive to the quantization signal to supply the indicated reference clock signal as a recovered clock signal on its output; and data recovery circuitry, connected to the receiver and the output of the clock selection circuitry, to produce a recovered data signal in response to the local, non-phase encoded data stream and the recovered clock signal; and wherein the reference clock generation circuitry includes:

a reference generator responsive to the local clock to generate a first reference wave and a second reference wave out of phase relative to the first reference wave; and a plurality of reference clock generators which generate respective reference clock signals in response to the first reference wave and second reference wave, each of the reference clock generators generating a reference clock signal having a phase determined by relative amplitudes of the first and second reference waves.

27. The apparatus of claim 26, wherein the non-phase encoded serial data has a non-return-to-zero (NRZ) format.

28. The apparatus of claim 26, wherein the first and second reference waves comprise triangle waves one quarter cycle out of phase.

29. The apparatus of claim 26, wherein the first and second reference waves comprise sine waves one quarter cycle out of phase.

30. The apparatus of claim 26, wherein the phase quantizing circuitry includes:

a plurality of memory elements, having respective inputs coupled to corresponding ones of the plurality of reference clock signals, which in response to the edge detection signal store a state of the plurality of reference clock signals upon a detected transition in the local data stream; and circuitry responsive to the stored state to supply the quantization signal.

31. The apparatus of claim 30, wherein the circuitry responsive to the stored state includes a decoder.

32. The apparatus of claim 31, wherein the decoder comprises a thermometer code reduced decoder.

33. The apparatus of claim 30, wherein the circuitry responsive to the stored state includes a filter which reduces effects of false transitions in the local data stream.

34. The apparatus of claim 30, wherein the circuitry responsive to the stored state includes:

a digital decoder responsive to the stored state to produce a state decode signal; and a recursive digital filter which filters the state decode signal to produce the quantization signal.

35. An apparatus for receiving transmitted, non-phase encoded serial data from a wireless communication medium, comprising:

a receiver adapted to produce a local, non-phase encoded serial data stream from the transmitted serial data in the wireless communication medium;

a local clock;

edge detection circuitry which receives the local, non-phase encoded data stream and generates edge detection signals indicating transitions in the local data stream;

a reference generator responsive to the local clock to generate a first reference wave and a second reference wave out of phase relative to the first reference wave;

a plurality of reference clock generators which generate a plurality of reference clock signals in response to the first reference wave and second reference wave, each of the reference clock generators generating a respective reference clock signal in the plurality of reference clock signals having a phase determined by relative amplitudes of the first and second reference waves;

phase quantizing circuitry, responsive to the edge detection signals and the plurality of reference clock signals, which generates a quantization signal indicating one of the plurality of reference clock signals having a particular phase relationship to the edge detection signals, including a plurality of memory elements, having respective inputs coupled to corresponding ones of the plurality of reference clock signals, which in response to the edge detection signal store a state of the plurality of reference clock signals, a digital decoder responsive to the stored state to produce a state decode signal, and a recursive digital filter which filters the state decode signal to produce the quantization signal;

clock selection circuitry, having inputs coupled to the plurality of reference clock signals and an output, and responsive to the quantization signal to supply the indicated reference clock signal as a recovered clock signal on its output; and data recovery circuitry, connected to the receiver and the output of the clock selection circuitry, to produce a recovered data signal in response to the local, non-phase encoded data stream and the recovered clock signal.

36. The apparatus of claim 35, wherein the first and second reference waves comprise triangle waves one quarter cycle out of phase.

37. The apparatus of claim 35, wherein the first and second reference waves comprise sine waves one quarter cycle out of phase.

38. A clock recovery circuit for a data stream, comprising:

an edge detection circuit which receives the data stream and generates edge detection signals indicating transitions in the data stream;

reference clock generation circuitry which generates a plurality of reference clock signals shifted in phase with respect to one another;

phase quantizing circuitry, responsive to the edge detection signals and the plurality of reference clock signals, which generates a quantization signal indicating one of the plurality of reference clock signals having a particular phase relationship to the edge detection signals; and clock selection circuitry, having inputs coupled to the plurality of reference clock signals, and responsive to the quantization signal to select the indicated reference clock signal; and wherein the reference clock generation circuitry includes:

a local clock input to receive a local clock;

a reference generator responsive to the local clock to generate a first reference wave and a second reference wave one quarter cycle out of phase relative to the first reference wave;

a monolithic resistor ladder receiving the first and second reference waves; and a plurality of reference clock generators, coupled to the resistor ladder, which generate respective reference clock signals in response to relative magnitudes of the first reference wave and second reference wave set by the resistor ladder.

* * * * *